(12) United States Patent
Kong et al.

(10) Patent No.: US 11,984,895 B2
(45) Date of Patent: May 14, 2024

(54) CALIBRATION METHOD AND CALIBRATION APPARATUS FOR DELAY OF QUANTUM COMPUTER SYSTEM

(71) Applicant: Origin Quantum Computing Technology (Hefei) Co., Ltd, Anhui (CN)

(72) Inventors: Weicheng Kong, Anhui (CN); Hanging Shi, Anhui (CN)

(73) Assignee: ORIGIN QUANTUM COMPUTING TECHNOLOGY (HEFEI) CO., LTD., Anhui (CN)

( * ) Notice: Subject to any disclaimer, the term of this patent is extended or adjusted under 35 U.S.C. 154(b) by 0 days.

(21) Appl. No.: 18/520,248

(22) Filed: Nov. 27, 2023

(65) Prior Publication Data

US 2024/0097664 A1    Mar. 21, 2024

Related U.S. Application Data

(63) Continuation of application No. PCT/CN2022/114222, filed on Aug. 23, 2022.

(30) Foreign Application Priority Data

Aug. 27, 2021  (CN) .......................... 202110996746.2
Sep. 18, 2021  (CN) .......................... 202111096648.X
Jan. 25, 2022  (CN) .......................... 202210096907.7

(51) Int. Cl.
*H03K 5/01* (2006.01)
*G06N 10/40* (2022.01)
*H03K 5/00* (2006.01)

(52) U.S. Cl.
CPC ............... *H03K 5/01* (2013.01); *G06N 10/40* (2022.01); *H03K 2005/00058* (2013.01)

(58) Field of Classification Search
None
See application file for complete search history.

(56) References Cited

U.S. PATENT DOCUMENTS

2022/0222567 A1* 7/2022 Reagor .................. G06N 10/40

FOREIGN PATENT DOCUMENTS

| CN | 111722084 A | 9/2020 |
| CN | 113011591 A | 6/2021 |
| WO | WO2019217772 A1 | 11/2019 |

* cited by examiner

*Primary Examiner* — Cassandra F Cox
(74) *Attorney, Agent, or Firm* — NORTON ROSE FULBRIGHT US LLP

(57) ABSTRACT

A calibration method and a calibration apparatus for a delay of a quantum computer system, wherein when the calibration method is implemented, a first control signal is first applied to the qubit on the quantum chip through the first transmission line, simultaneously a second control signal with a preset delay is applied to the qubit through the second transmission line, then the preset delay is updated sequentially within a preset range, and the second control signal with updated preset delay is applied to the qubit, so as to obtain a change curve representing a probability of the quantum state of the qubit being an eigenstate as a function of the preset delay, and then it is determined whether the change curve has a trough, if the change curve has a trough, finally, delay calibration is performed for the first transmission line and the second transmission line based on the preset delay corresponding to the trough of the change curve, so as to eliminate the transmission delay caused by different line lengths and different microwave devices added on the lines, so that the control signals on different lines can reach the quantum chip according to the designed time sequence, thereby realizing the precise regulation of the quantum states.

20 Claims, 16 Drawing Sheets

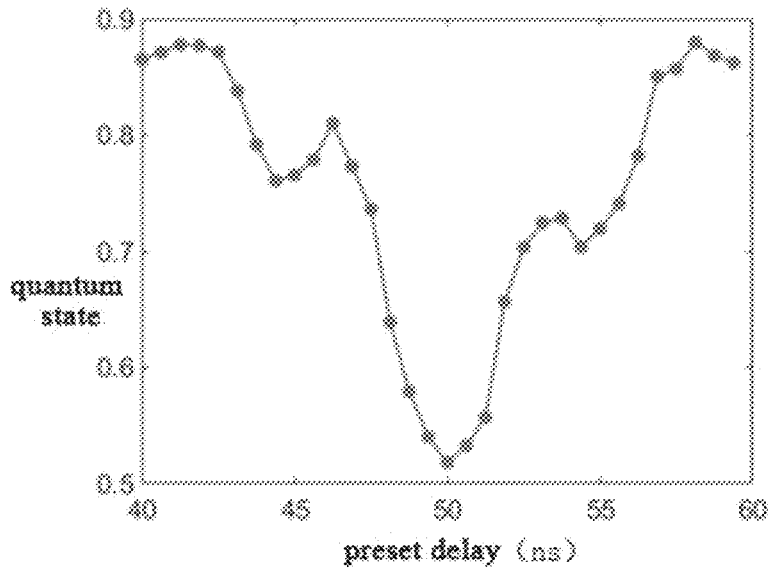

Fig. 13 applying a first quantum state control signal to a first qubit through the quantum state control signal transmission line, and applying a second quantum state control signal to a second qubit coupled with the first qubit through the quantum state control signal transmission line; wherein the first quantum state control signal is to control a quantum state of the first qubit to an excited state, and the second quantum state control signal is to control a quantum state of the second qubit to a ground state — S11 applying a second frequency control signal with the second amplitude to the second qubit through the frequency control signal transmission line, wherein the second amplitude is a preset fixed value — S12 updating an amplitude of the first frequency control signal sequentially within a second preset range, and applying the first frequency control signal with the updated amplitude to the first qubit through the frequency control signal transmission line, to obtain a second curve representing a probability of the quantum state of the first qubit being an excited state as a function of the amplitude of the first frequency control signal — S13 acquiring an amplitude corresponding to a trough of the second curve as the first amplitude of the first frequency control signal — S14

Fig. 14

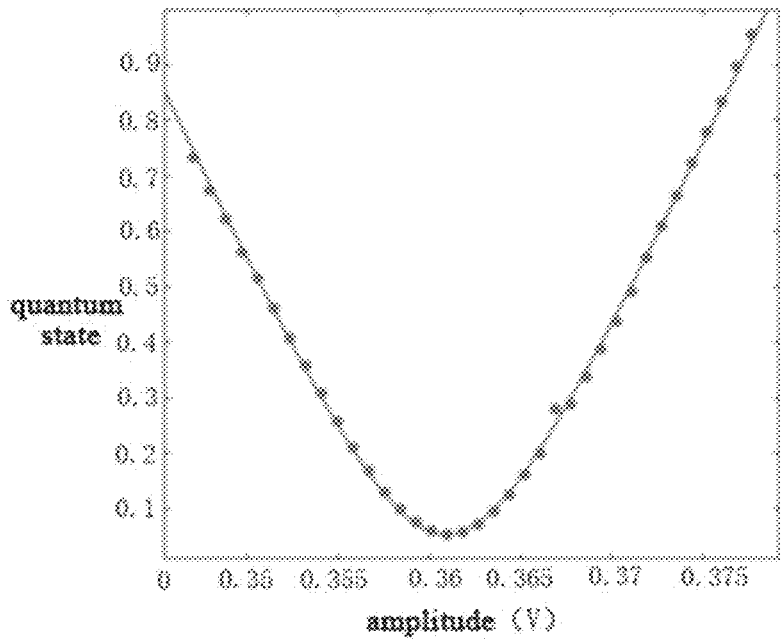

Fig. 15 applying a first frequency control signal with the first amplitude to the first qubit through the frequency control signal transmission line, and applying a second frequency control signal with the second amplitude to the second qubit through the frequency control signal transmission line — S21 updating widths of the first frequency control signal and the second frequency control signal sequentially within a third preset range, applying the first frequency control signal with the updated width to the first qubit through the frequency control signal transmission line, and applying the second frequency signal with the updated width to the second qubit through the frequency control signal transmission line; acquiring a third curve and a fourth curve, wherein the third curve represents a probability of the quantum state of the first qubit being an excited state and the quantum state of the second qubit being a ground state as a function of the widths, and the fourth curve represents a probability of the quantum state of the first qubit being a ground state and the quantum state of the second qubit being an excited state as a function of the widths; wherein the widths of the first frequency control signal and the second frequency control signal are always equal and varying synchronously — S22 acquiring a width corresponding to an intersection point of the third curve and the fourth curve as the first width of the first frequency control signal and of the second frequency control signal — S23

Fig. 16

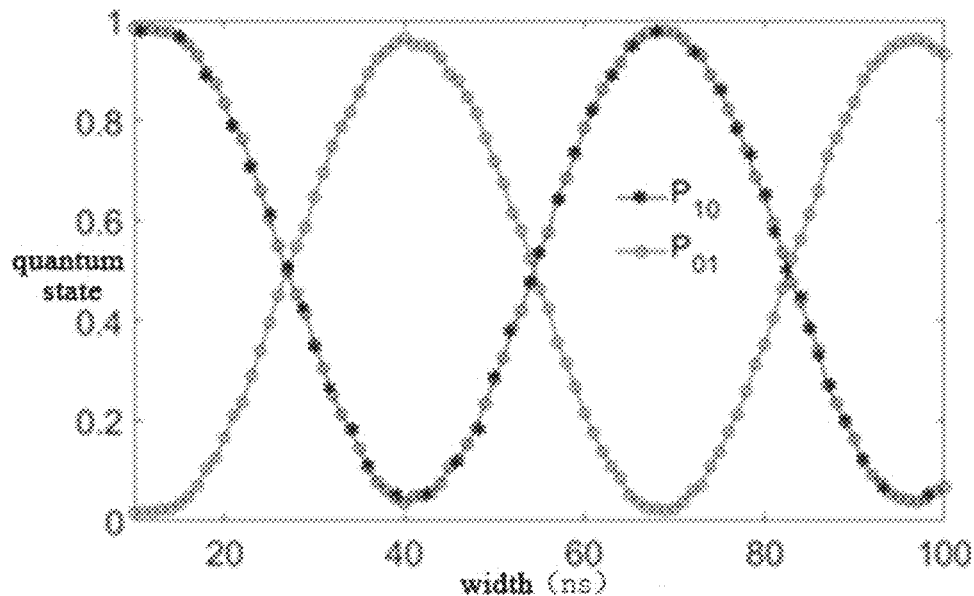

Fig. 17

```
acquiring widths corresponding to each of         S181
intersection points of the third curve and the
              fourth curve
                    ↓
  selecting a smallest width among respective     S182
            widths as the first width
```

Fig. 18

```
  acquiring the preset delay corresponding to the    S511
     trough of the first curve as a target delay
                       ↓
   compensating the target delay for the second      S512
  frequency control signal to perform the delay
   calibration for the frequency control signal
 transmission lines connected with the two qubits
```

Fig. 19

CALIBRATION METHOD AND CALIBRATION APPARATUS FOR DELAY OF QUANTUM COMPUTER SYSTEM

The present application claims the priority to a China patent application No. 20211096746.2, filed with China National Intellectual Property Administration on Aug. 27, 2021 and entitled "Calibration Method and Calibration Apparatus for Delay of Quantum Computer System", the priority to a China patent application No. 202111096648.X, filed with China National Intellectual Property Administration on Sep. 18, 2021 and entitled "Calibration Method and Calibration Apparatus for Delay of Quantum Computer System and Quantum Computer", and the priority to a China patent application No. 202210096907.7, filed with China National Intellectual Property Administration on Jan. 25, 2022 and entitled "Calibration Method and Calibration Apparatus for Delay of Quantum Computer System and Quantum Computer", which are incorporated herein by reference in their entirety.

TECHNICAL FIELD

The present application relates to the technical field of quantum chip measurement and control, and particularly relates to a calibration method and a calibration apparatus for a delay of a quantum computer system.

BACKGROUND

Quantum computing is a new type of computing method combining quantum mechanics with computers, which conducts computing by following the laws of quantum mechanics and controlling quantum information units. It has a basic unit of qubit composed of microscopic particles, which has the characteristics of quantum superposition and entanglement. Moreover, through the controlled evolution of quantum states, quantum computing can realize information encoding and computing storage, with a huge amount of information carrying capacity and super parallel computing processing ability that classical computing cannot match.

The core of a quantum computer is a quantum chip on which a large number of qubit mechanisms are arranged. Each qubit consists of a specific hardware circuit arranged on the quantum chip, and each qubit has at least two distinguishable logic states. Based on the quantum algorithm, the logic state of the qubit can be controllably changed, so as to realize quantum computing.

The quantum computer also comprises a measurement and control system that provides a measurement and control environment for the quantum chip. The measurement and control system mainly comprises hardware equipment located in a room temperature layer, low-temperature devices and signal transmission lines located in the dilution refrigerator. After the quantum chip is packaged, the quantum chip was fixed on the lowest layer of the dilution refrigerator and finally connected to the hardware equipment at room temperature through the coaxial line between the layers. In this measurement and control system, two kinds of lines are mainly used to control the quantum states of qubits, one is the first transmission line for driving the quantum states of qubits, and the other is the second transmission line for controlling the frequency of qubits. However, due to the different lengths of different transmission lines and different microwave devices are added to the lines, the transmission delays of signals on different lines are different, which results in that different control signals cannot reach the quantum chip in accordance with the designed time sequence, thus the accuracy of controlling the quantum states of the qubits is low. Therefore, how to calibrate the line delay between the first transmission line and the second transmission line to ensure that the control signals on the first transmission line and the second transmission line can reach the quantum chip strictly according to the designed time sequence, and realize the precise controlling of the quantum states is an urgent problem to be solved at present.

SUMMARY

The object of the present application is to provide a calibration method and a calibration apparatus for a delay of a quantum computer system, so as to solve the problem in the prior art that the transmission delays of signals on different lines are different due to different cable lengths of different transmission lines and the addition of different microwave devices on the lines, so that different control signals cannot reach the quantum chip according to the designed time sequence, and different control signals cannot reach the quantum chip in accordance with the designed time sequence, thus the accuracy of controlling the quantum states of the qubits is low. A precise control of quantum state is realized.

In order to achieve the above object, in a first aspect, the present application provides a calibration method for a delay of a quantum computer system, comprising a quantum chip and a first transmission line and a second transmission line connecting a qubit on the quantum chip, wherein the calibration method comprises:

applying a first control signal to the qubit on the quantum chip through the first transmission line, and simultaneously applying a second control signal with a preset delay to the qubit through the second transmission line; wherein the first control signal is to control a quantum state of the qubit to an eigenstate, the second control signal is to control a frequency of the qubit, and a change of the frequency of the qubit affects a probability of the quantum state being an eigenstate;

updating the preset delay sequentially within a preset range, and applying the second control signal with the updated preset delay to the qubit to obtain a change curve representing a probability of the quantum state of the qubit being an eigenstate as a function of the preset delay; wherein the preset range is set according to lengths of the first transmission line and the second transmission line;

determining whether the change curve has a trough; and if the change curve has a trough, performing delay calibration for the first transmission line and the second transmission line based on a preset delay corresponding to the trough of the change curve.

Combining with the first aspect, in a second embodiment, performing delay calibration for the first transmission line and the second transmission line based on a preset delay corresponding to the trough of the change curve, specifically comprises:

acquiring the preset delay corresponding to the trough of the change curve;

determining an inherent delay between the first control signal and the second control signal;

determining a relative delay between the first transmission line and the second transmission line based on the preset delay and the inherent delay;

compensating the relative delay for the second control signal to perform the delay calibration for the first transmission line and the second transmission line.

Combining with the second embodiment of the first aspect, in a third embodiment, determining a relative delay between the first transmission line and the second transmission line based on the preset delay and the inherent delay, specifically comprises:
  if T1>T2, determining the relative delay to be a difference between the preset delay and the inherent delay;
  if T1<T2, determining the relative delay to be a sum of the preset delay and the inherent delay;
  wherein, T1 is a wavelength period of the first control signal and T2 is a wavelength period of the second control signal.

Combining with the first aspect, in a fourth embodiment, determining whether the change curve has a trough further comprises:
  if the change curve does not have a trough, delaying the first control signal by a first time, and returning to perform the step of applying the first control signal to the qubit on the quantum chip through the first transmission line.

Combined with the fourth embodiment of the first aspect, in a fifth embodiment, when the change curve has the trough after the first control signal is delayed by the first time, performing delay calibration for the first transmission line and the second transmission line based on a preset delay corresponding to the trough of the change curve, specifically comprises:
  acquiring the preset delay corresponding to the trough of the change curve;
  determining an inherent delay between the first control signal and the second control signal;
  determining a relative delay between the first transmission line and the second transmission line based on the preset delay, the inherent delay and the first time;
  compensating the relative delay for the first control signal to perform the delay calibration for the first transmission line and the second transmission line.

Combining with the fifth embodiment of the first aspect, in a sixth embodiment, determining a relative delay between the first transmission line and the second transmission line based on the preset delay, the inherent delay and the first time, specifically comprises:
  if T1>T2, then d3=d-d1-d2;
  if T1<T2, then d3=d-d1+d2;
  wherein, d3 is the relative delay, d is the first time, d1 is the preset delay, d2 is the inherent delay, T1 is a wavelength period of the first control signal and T2 is a wavelength period of the second control signal.

Combining with the first aspect, in a seventh embodiment, before applying a first control signal to the qubit on the quantum chip through the first transmission line, and simultaneously applying a second control signal with a preset delay to the qubit through the second transmission line, the method further comprises:
  determining an inherent delay between the first control signal and the second control signal;
  if T1>T2, delaying the second control signal by the inherent delay, so that a center of a waveform of the first control signal and a center of a waveform of the second control signal are aligned;
  if T1<T2, delaying the first control signal by the inherent delay, so that a center of a waveform of the first control signal and a center of a waveform of the second control signal are aligned;
  wherein, T1 is a wavelength period of the first control signal and T2 is a wavelength period of the second control signal.

Combining with the seventh embodiment of the first aspect, in an eighth embodiment, performing delay calibration for the first transmission line and the second transmission line based on a preset delay corresponding to the trough of the change curve, specifically comprises:
  acquiring the preset delay corresponding to the trough of the change curve;
  determining a relative delay between the first transmission line and the second transmission line based on the preset delay and the inherent delay; compensating the relative delay for the second control signal to perform the delay calibration for the first transmission line and the second transmission line.

Combining with the eighth embodiment of the first aspect, in a ninth embodiment, determining a relative delay between the first transmission line and the second transmission line based on the preset delay and the inherent delay, specifically comprises:
  if T1>T2, determining the relative delay to be equal to the preset delay; if T1<T2, determining the relative delay to be equal to a sum of the preset delay and the inherent delay;
  wherein, T1 is a wavelength period of the first control signal and T2 is a wavelength period of the second control signal.

Combining with the seventh embodiment of the first aspect, in a tenth embodiment, determining whether the change curve has a trough further comprises:
  if the change curve does not have a trough, delaying the first control signal by a first time, and returning to perform the step of applying the first control signal to the qubit on the quantum chip through the first transmission line.

Combined with the tenth embodiment of the first aspect, in an eleventh embodiment, when the change curve has the trough after the first control signal is delayed by the first time, performing delay calibration for the first transmission line and the second transmission line based on a preset delay corresponding to the trough of the change curve, specifically comprises:
  acquiring the preset delay corresponding to the trough of the change curve;
  determining a relative delay between the first transmission line and the second transmission line based on the preset delay, the inherent delay and the first time;
  compensating the relative delay for the first control signal to perform the delay calibration for the first transmission line and the second transmission line.

Combining with the eleventh embodiment of the first aspect, in a twelfth embodiment, determining a relative delay between the first transmission line and the second transmission line based on the preset delay, the inherent delay and the first time, specifically comprises:

if $T1>T2$, then $d3=d-d1$;

if $T1<T2$, then $d3=d+d2-d1$;

wherein, d3 is the relative delay, d is the first time, d1 is the preset delay, d2 is the inherent delay, T1 is a wavelength period of the first control signal and T2 is a wavelength period of the second control signal.

In a second aspect, the present application provides a calibration method for a delay of a quantum computer system comprising a quantum chip with a plurality of qubits arranged thereon, each of the qubits being connected with a quantum state control signal transmission line and a frequency control signal transmission line, wherein the calibration method comprises:

presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits; wherein the resonance experiment is an experiment for measuring a coupling strength of the two qubits as a function of the amplitudes of the frequency control signals;

acquiring a first width of the frequency control signals based on the first amplitude and the second amplitude of the frequency control signals applied on the frequency control signal transmission lines of the two qubits and a quantum state oscillation experiment of the two qubits; wherein the quantum state oscillation experiment is an experiment for measuring quantum states of the two qubits as a function of the width of the frequency control signals;

applying a first frequency control signal with the first amplitude and the first width to a frequency control signal transmission line connected with one of the two qubits, updating a preset delay sequentially within a first preset range, and applying a second frequency control signal with the updated preset delay having the second amplitude and the first width to a frequency control signal transmission line connected with the other of the two qubits, to obtain a first curve representing a probability of the quantum states of the two qubits being an excited state and a ground state respectively as a function of the preset delay;

determining whether the first curve has a trough; and if the first curve has a trough, performing delay calibration for the frequency control signal transmission lines connected with the two qubits based on a preset delay corresponding to the trough of the first curve.

Combining with the second aspect, in a second embodiment, presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits, specifically comprises:

applying a first quantum state control signal to a first qubit through the quantum state control signal transmission line, and applying a second quantum state control signal to a second qubit coupled with the first qubit through the quantum state control signal transmission line; wherein the first quantum state control signal is to control a quantum state of the first qubit to an excited state, and the second quantum state control signal is to control a quantum state of the second qubit to a ground state;

applying a second frequency control signal with the second amplitude to the second qubit through the frequency control signal transmission line, wherein the second amplitude is a preset fixed value;

updating an amplitude of the first frequency control signal sequentially within a second preset range, and applying the first frequency control signal with the updated amplitude to the first qubit through the frequency control signal transmission line, to obtain a second curve representing a probability of the quantum state of the first qubit being an excited state as a function of the amplitude of the first frequency control signal;

acquiring an amplitude corresponding to a trough of the second curve as the first amplitude of the first frequency control signal.

Combining with the second aspect, in a third embodiment, acquiring a first width of the frequency control signals based on the first amplitude and the second amplitude of the frequency control signals applied on the frequency control signal transmission lines of the two qubits and a quantum state oscillation experiment of the two qubits, specifically comprises:

applying a first frequency control signal with the first amplitude to the first qubit through the frequency control signal transmission line, and applying a second frequency control signal with the second amplitude to the second qubit through the frequency control signal transmission line;

updating widths of the first frequency control signal and the second frequency control signal sequentially within a third preset range, applying the first frequency control signal with the updated width to the first qubit through the frequency control signal transmission line, and applying the second frequency signal with the updated width to the second qubit through the frequency control signal transmission line; acquiring a third curve and a fourth curve, wherein the third curve represents a probability of the quantum state of the first qubit being an excited state and the quantum state of the second qubit being a ground state as a function of the widths, and the fourth curve represents a probability of the quantum state of the first qubit being a ground state and the quantum state of the second qubit being an excited state as a function of the widths; wherein the widths of the first frequency control signal and the second frequency control signal are always equal and varying synchronously;

acquiring a width corresponding to an intersection point of the third curve and the fourth curve as the first width of the first frequency control signal and of the second frequency control signal.

Combining with the third embodiment of the second aspect, in a fourth embodiment, acquiring a width corresponding to an intersection point of the third curve and the fourth curve as the first width of the first frequency control signal and of the second frequency control signal, specifically comprises:

acquiring widths corresponding to each of intersection points of the third curve and the fourth curve;

selecting a smallest width among respective widths as the first width.

Combining with the second aspect, in a fifth embodiment, performing delay calibration for the frequency control signal transmission lines connected with the two qubits based on a preset delay corresponding to the trough of the first curve, specifically comprises:

acquiring the preset delay corresponding to the trough of the first curve as a target delay;

compensating the target delay for the second frequency control signal to perform the delay calibration for the frequency control signal transmission lines connected with the two qubits.

Combining with the second aspect, in a sixth embodiment, determining whether the change curve has a trough further comprises:

if the change curve does not have a trough, delaying the first frequency control signal by a first time, and returning to perform a step of applying a first frequency control signal with the first amplitude and the first width to a frequency control signal transmission line connected with one of the two qubits.

Combining with the sixth embodiment of the second aspect, in a seventh embodiment, when the first curve has a trough after the first frequency control signal is delayed by the first time, performing delay calibration for the frequency control signal transmission lines connected with the two qubits based on a preset delay corresponding to the trough of the first curve, specifically comprises:

acquiring the preset delay corresponding to the trough of the first curve as a target delay;

determining a relative delay between the frequency control signal transmission lines of the two qubits based on the first time and the target delay;

compensating the relative delay for the first frequency control signal to perform the delay calibration for the frequency control signal transmission lines connected with the two qubits.

Combined with the seventh embodiment of the second aspect, in an eighth embodiment, the relative delay is an absolute value of the difference between the first time and the target delay.

In a third aspect, the present application provides a calibration method for a delay of a quantum computer system comprising a quantum chip with a plurality of qubits arranged thereon, each of the qubits being connected with a quantum state control signal transmission line and a frequency control signal transmission line, wherein the calibration method comprises:

acquiring a first delay between a quantum state control signal transmission line and a frequency control signal transmission line connected with a first qubit and a second delay between a quantum state control signal transmission line and a frequency control signal transmission line connected with a second qubit; wherein the first qubit and the second qubit are coupled with each other;

acquiring a third delay between frequency control signal transmission lines connected with the first qubit and the second qubit respectively;

acquiring a fourth delay between quantum state control signal transmission lines connected with the first qubit and the second qubit based on the first delay, the second delay and the third delay, and performing delay calibration based on the fourth delay.

Combining with the third aspect, in a second embodiment, acquiring a first delay between a quantum state control signal transmission line and a frequency control signal transmission line connected with a first qubit and a second delay between a quantum state control signal transmission line and a frequency control signal transmission line connected with a second qubit, specifically comprises:

acquiring the first delay between the quantum state control signal transmission line and the frequency control signal transmission line connected with the first qubit and the second delay between the quantum state control signal transmission line and the frequency control signal transmission line connected with the second qubit based on a representation of a quantum state evolution of the qubits as a function of their quantum state control signals and frequency control signals.

Combining with the second embodiment of the third aspect, in a third embodiment, acquiring a third delay between frequency control signal transmission lines connected with the first qubit and the second qubit respectively, specifically comprises:

acquiring the third delay between frequency control signal transmission lines connected with the first qubit and the second qubit respectively based on a representation of a quantum state evolution of two qubits coupled with each other as a function of their quantum state control signals and frequency control signals.

Combining with the third aspect, in a fourth embodiment, acquiring a fourth delay between quantum state control signal transmission lines connected with the first qubit and the second qubit based on the first delay, the second delay and the third delay, specifically comprises:

presetting a duration of a quantum state control signal applied to the quantum state control signal transmission line connected with the first qubit as a first time;

determining a duration of a frequency control signal applied to the frequency control signal transmission line connected with the first qubit as a second time based on the first time and the first delay;

determining a duration of a frequency control signal applied to the frequency control signal transmission line connected with the second qubit as a third time based on the second time and the third delay;

determining a duration of a quantum state control signal applied to the quantum state control signal transmission line connected with the second qubit as a fourth time based on the third time and the second delay;

determining the fourth delay between quantum state control signal transmission lines connected with the first qubit and the second qubit respectively based on the first time and the fourth time.

Combining with the fourth embodiment of the third aspect, in the fifth embodiment, acquiring a first delay between the quantum state control signal transmission line and the frequency control signal transmission line connected with the first qubit based on a representation of a quantum state evolution of the qubit as a function of its quantum state control signal and frequency control signal, specifically comprises:

applying a first control signal to the first qubit through a quantum state control signal transmission line connected with the first qubit, and applying a second control signal with a first preset delay to the first qubit through a frequency control signal transmission line connected with the first qubit; wherein, the first control signal is to control a quantum state of the first qubit to an eigenstate, and the second control signal is to control a frequency of the first qubit, and a change of the frequency of the first qubit affects a probability of the quantum state being an eigenstate;

updating the first preset delay sequentially within a first preset range, and applying a second control signal with the updated first preset delay to the first qubit to obtain a first curve representing a probability of the quantum state of the first qubit being an eigenstate as a function of the first preset delay; wherein the first preset range is set according to lengths of the quantum state control signal transmission line and the frequency control signal transmission line connected with the first qubit;

determining whether the first curve has a trough; and if the first curve has a trough, determining the first delay based on a first preset delay corresponding to the trough of the first curve.

Combined with the fifth embodiment of the third aspect, in a sixth embodiment, after determining whether the first curve has a trough, it further comprises:

if the change curve does not have a trough, delaying the first control signal by a first fixed duration, and returning to perform the step of applying the first control signal to the first qubit through the quantum state control signal transmission line connected with the first qubit.

Combined with the sixth embodiment of the third aspect, in a seventh embodiment, when the first curve has a trough after the first control signal is delayed by the first fixed duration, determining the first delay based on a first preset delay corresponding to the trough of the first curve, specifically comprises:

acquiring respectively a first preset delay corresponding to the trough of the first curve;

determining respectively the first delay based on first preset delay and the first fixed duration.

Combining with the third embodiment of the third aspect, in an eighth embodiment, acquiring the third delay between frequency control signal transmission lines connected with the first qubit and the second qubit respectively based on a representation of a quantum state evolution of two qubits coupled with each other as a function of their quantum state control signals and frequency control, specifically comprises:

presetting quantum states of the first qubit and the second qubit as an excited state and a ground state respectively, and acquiring respectively a first amplitude and a second amplitude of frequency control signals applied to frequency control signal transmission lines connected with the first qubit and the second qubit based on a resonance experiment of the first qubit and the second qubit; wherein the resonance experiment is an experiment for measuring a coupling strength of the first qubit and the second qubit as a function of the amplitudes of the frequency control signals;

acquiring a first width of the frequency control signals based on the first amplitude and the second amplitude of the frequency control signals applied on the frequency control signal transmission lines connected with the first qubit and the second qubit, and a quantum state oscillation experiment of the first qubit and the second qubit; wherein the quantum state oscillation experiment is an experiment for measuring quantum states of the first qubit and the second qubit as a function of the width of the frequency control signals;

applying a first frequency control signal with the first amplitude and the first width to a frequency control signal transmission line connected with the first qubit, updating a second preset delay sequentially within a fourth preset range, and applying a second frequency control signal with the updated second preset delay having the second amplitude and the first width to a frequency control signal transmission line connected with the second qubit, to obtain a fifth curve representing a probability of the quantum states of the first qubit and the second qubit being an excited state and a ground state respectively as a function of the second preset delay;

determining whether the fifth curve has a trough; and if the fifth curve has a trough, determining the third delay based on a second preset delay corresponding to the trough of the fifth curve.

Combined with the eighth embodiment of the third aspect, in the ninth embodiment, after determining whether the fifth curve has a trough, it further comprises:

if the fifth curve does not have a trough, delaying the first frequency control signal by a second fixed duration, and returning to perform a step of applying the first frequency control signal with the first amplitude and the first width to the frequency control signal transmission line connected with the first qubit.

Combined with the ninth embodiment of the third aspect, in a tenth embodiment, when the fifth curve has a trough after the first frequency control signal is delayed by the second fixed duration, determining the third delay based on a second preset delay corresponding to the trough of the fifth curve, specifically comprises:

acquiring the second preset delay corresponding to the trough of the fifth curve;

determining the third delay based on the second preset delay and the second fixed duration.

In a fourth aspect, the present application provides a calibration apparatus for a delay of a quantum computer system, comprising:

a signal applying module, configured for applying a first control signal to a qubit on a quantum chip through a first transmission line, and simultaneously applying a second control signal with a preset delay to the qubit through a second transmission line; wherein the first control signal is to control a quantum state of the qubit to an eigenstate, the second control signal is to control a frequency of the qubit, and a change of the frequency of the qubit affects a probability of the quantum state being an eigenstate;

an acquiring module, configured for updating the preset delay sequentially within a preset range, and applying a second control signal with the updated preset delay to the qubit to obtain a change curve representing a probability of the quantum state of the qubit being an eigenstate as a function of the preset delay; wherein the preset range is set according to lengths of the first transmission line and the second transmission line;

a calibrating module, configured for determining whether the change curve has a trough; and for performing delay calibration for the first transmission line and the second transmission line based on a preset delay corresponding to the trough of the change curve.

In a fifth aspect, the present application provides a calibration apparatus for a delay of a quantum computer system, comprising:

a resonance experiment module, configured for presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits; wherein the resonance experiment is an experiment for measuring a coupling strength of the two qubits as a function of amplitudes of the frequency control signals;

a quantum state oscillation experiment module, configured for acquiring a first width of the frequency control signals based on the first amplitude and the second amplitude of the frequency control signals applied on the frequency control signal transmission lines of the two qubits and a quantum state oscillation experiment of the two qubits; wherein the quantum state oscillation experiment is an experiment for measuring quantum states of the two qubits as a function of the width of the frequency control signals;

a delay experiment module, configured for applying a first frequency control signal with the first amplitude and the first width to a frequency control signal transmission line connected with one of the two qubits, updating a preset delay sequentially within a preset range, and applying a second frequency control signal with the updated preset delay having the second amplitude and the first width to a frequency control signal transmission line connected with the other of the two qubits, to obtain a first curve representing a probability of the two qubits being an excited state and a ground state respectively as a function of the preset delay;

a calibration module, configured for performing, if the first curve has a trough, delay calibration for the frequency control signal transmission lines connected with the two qubits based on a preset delay corresponding to the trough of the first curve.

In a sixth aspect, the present application provides a calibration apparatus for a delay of a quantum computer system, comprising:

a first acquiring module, configured for acquiring a first delay between a quantum state control signal transmission line and a frequency control signal transmission line connected with a first qubit and a second delay between a quantum state control signal transmission line and a frequency control signal transmission line connected with a second qubit based on a representation of a quantum state evolution of the qubits as a function of their quantum state control signals and frequency control signals; wherein the first qubit and the second qubit are coupled with each other;

a second acquiring module, configured for acquiring a third delay between frequency control signal transmission lines connected with the first qubit and the second qubit respectively based on a representation of a quantum state evolution of two qubits coupled with each other as a function of their quantum state control signals and frequency control signals;

a calibrating module, configured for acquiring a fourth delay between quantum state control signal transmission lines connected with the first qubit and the second qubit based on the first delay, the second delay and the third delay, and performing delay calibration based on the fourth delay.

In a seventh aspect, the present application provides a quantum computer system, comprising a quantum chip, a first transmission line and a second transmission line connected with a qubit on the quantum chip, and a calibration apparatus for a delay of the quantum computer system in the fourth aspect, wherein the calibration apparatus for the delay of the quantum computer system is connected with the first transmission line and the second transmission line for implementing the calibration method for a delay of the quantum computer system in the first aspect.

In an eighth aspect, the present application provides a quantum computer, comprising a quantum chip and a calibration apparatus for a delay of the quantum computer system in the fifth aspect, wherein a plurality of qubits coupled with each other are arranged on the quantum chip, and each of the qubits is connected with a quantum state control signal transmission line and a frequency control signal transmission line, and the calibration apparatus for a delay of the quantum computer system is connected with the quantum state control signal transmission line and the frequency control signal transmission line for implementing the calibration method for a delay of the quantum computer system in the fourth aspect.

In a ninth aspect, the present application provides a quantum computer, comprising a quantum chip and a calibration apparatus for a delay of the quantum computer system in the sixth aspect, wherein a plurality of qubits coupled with each other are arranged on the quantum chip, and each of the qubits is connected with a quantum state control signal transmission line and a frequency control signal transmission line, and the calibration apparatus for a delay of the quantum computer system is connected with the quantum state control signal transmission line and the frequency control signal transmission line for implementing the calibration method for a delay of the quantum computer system in the seventh aspect.

In a tenth aspect, the present application provides a computer-readable storage medium storing a computer program therein, which when executed by a processor, implements any one of the calibration method for a delay of a quantum computer system in the present application.

In an eleventh aspect, the present application provides a computer program product, when run on a computer, causes the computer to perform any one of the calibration method for a delay of a quantum computer system in the present application.

The embodiments of the present application have the following beneficial effect.

Compared with the prior art, the calibration method and the calibration apparatus for a delay of a quantum computer system provided by the present application have the following beneficial effects that; the quantum computer system comprises a quantum chip and a first transmission line and a second transmission line which is connected to a qubit on the quantum chip; when the calibration method is implemented, a first control signal is first applied to the qubit on the quantum chip through the first transmission line, simultaneously a second control signal with a preset delay is applied to the qubit through the second transmission line, then the preset delay is updated sequentially within a preset range, and the second control signal with updated preset delay is applied to the qubit, so as to obtain a change curve representing a probability of the quantum state of the qubit being an eigenstate as a function of the preset delay, and then it is determined whether the change curve has a trough, if the change curve has a trough, delay calibration is finally performed for the first transmission line and the second transmission line based on the preset delay corresponding to the trough of the change curve, so as to eliminate the transmission delay caused by different line lengths and different microwave devices added on the lines, so that the control signals on different lines can reach the quantum chip according to the designed time sequence, thereby realizing the precise regulation of the quantum states.

BRIEF DESCRIPTION OF THE DRAWINGS

In order to explain the embodiments of the present application and the technical solutions in the prior art more clearly, the drawings needed in the description of the embodiments and the prior art will be briefly introduced below. Obviously, the drawings in the following description are only some embodiments of the present application, and other drawings can be obtained according to these drawings for those skilled in the art without creative efforts.

FIG. 13 is a first curve representing a probability of the quantum states of the two qubits being an excited state and a ground state respectively as a function of the preset delay provided by an embodiment of the present application;

FIG. 14 is a schematic flow diagram of a method for presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits provided by an embodiment of the present application;

FIG. 15 is a second curve representing a probability of a quantum state of a first qubit being an excited state as a function of the amplitude of the first frequency control signal according to an embodiment of the present application;

FIG. 16 is a schematic flow diagram of a method for acquiring a first width of the frequency control signals based on the first amplitude and the second amplitude of the frequency control signals applied on the frequency control signal transmission lines of the two qubits and a quantum state oscillation experiment of the two qubits, provided by an embodiment of the present application;

FIG. 17 is a third curve representing a probability of the quantum state of the first qubit being an excited state and the quantum state of the second qubit being a ground state as a function of the widths, and a fourth curve representing a probability of the quantum state of the first qubit being a ground state and the quantum state of the second qubit being an excited state as a function of the widths, provided by an embodiment of the present application:

FIG. 18 is a schematic flow diagram of a method for acquiring a width corresponding to an intersection point of the third curve and the fourth curve as the first width of the first frequency control signal and of the second frequency control signal, provided by an embodiment of the present application:

FIG. 19 is a schematic flow diagram of performing delay calibration for the frequency control signal transmission lines connected with the two qubits based on a preset delay corresponding to the trough of the first curve, provided by an embodiment of the present application;

REFERENCE SIGN

100—computer terminal; 101—processor; 102—power supply; 103—transmission apparatus; 104—input/output device; 105—memory. 200—calibration apparatus; 201—signal applying module; 202—acquiring module; 203—calibrating module; 1—dilution refrigerator; 2—quantum chip; 21—qubit; 3—microwave device; 4—hardware device.

DETAILED DESCRIPTION

In order to make the purpose, technical solution and advantages of the present invention more clear, the calibration method and the calibration apparatus for a delay of a quantum computer system proposed in the present application will be further described in detail with reference to the attached drawings and embodiments. Advantage and features of the present application will become more apparent from the follow description. It should be noted that all the drawings are in a very simplified form and use imprecise scales, which are only used to facilitate and clearly illustrate the purpose of the embodiment of the present application. Obviously, the described embodiment is only a part, not all of the embodiments of the present application. Based on the embodiments in the present application, all other embodiments obtained by those skilled in the art without creative effort fall within the protection scope of the present application.

In the description of the present application, the terms "first" and "second" are only used for descriptive purposes, and cannot be understood as indicating or implying relative importance or implicitly indicating the number of indicated technical features. Therefore, the features defined as "first" and "second" may explicitly or implicitly include one or more of these features. In the description of the present application, "plurality" means at least two, such as two, three, etc., unless otherwise specifically defined.

Figure 1:
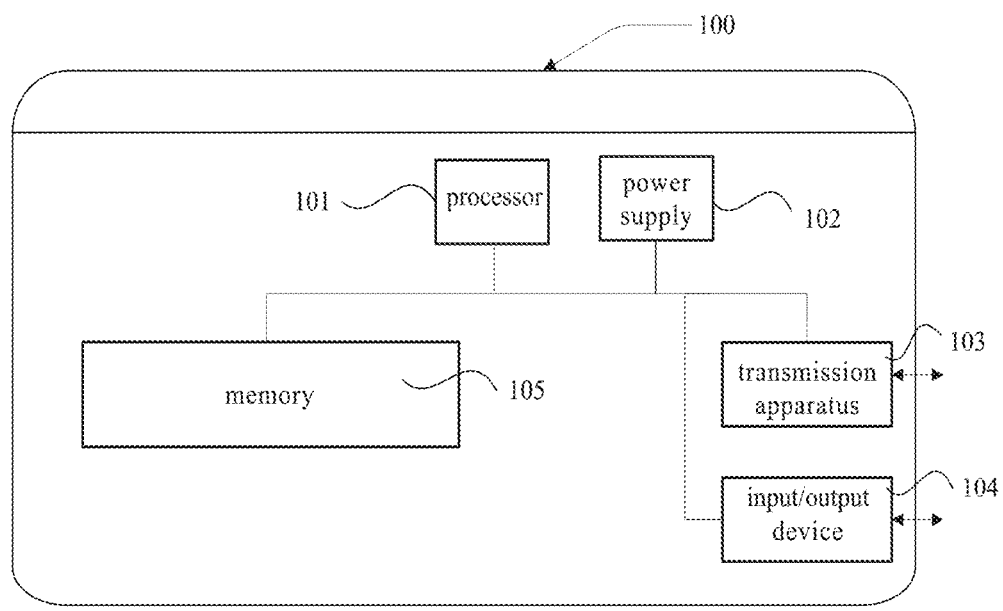
FIG. 1 is a block diagram of a hardware structure of a computer terminal on which a calibration method for a delay of a computer system is executed provided by an embodiment of the present application.

The method provided in the embodiment can be executed in a computer terminal or similar computing apparatus. Taking running on a computer terminal as an example, please refer to FIG. 1. The computer terminal 100 comprises a power supply 102, and may comprise one or more (only one is shown in FIG. 1) processors 101 (wherein the processor 101 may comprise but not limited to processing apparatuses such as micro-processing MCU or programmable logic device FPGA) and a memory 105 for storing data. Optionally, the computer terminal 100 may also comprise a transmission apparatus 103 for communication functions and an input/output device 104. It can be understood by those skilled in the art that the structure shown in FIG. 1 is only schematic, and it does not aim at limiting the structure of the above-mentioned computer terminal. For example, the computer terminal may also comprise more or fewer components than those shown in FIG. 1, or have a different configuration from that shown in FIG. 1.

The memory 105 can be used to store modules and software programs of application software, such as program instructions/modules corresponding to a determination method for a multi-qubits measurement result provided by the present application. The processor 101 executes various functional applications and data processing, that is, realizes the above method, by running the software programs and modules stored in the memory 105. The memory 105 may comprise a high-speed random access memory and may also comprise a non-volatile solid-state memory. In some embodiments, the memory 105 may further comprise remote memories remotely located with respect to the processor 101, and these remote memories may be connected to computer terminals through a network. Examples of the above networks comprise, but are not limited to, the Internet, intranets, local area networks, mobile communication networks, and combinations thereof.

The transmission apparatus 103 is used to receive or send data via a network. Specific examples of the above-mentioned network may comprise a wireless network provided by a communication provider of a computer terminal. In one embodiment, the transmission apparatus 103 comprises a Network Interface Controller (NIC), which can be connected with other network devices through a base station so as to communicate with the Internet. In an embodiment, the transmission apparatus 103 may be a Radio Frequency (RF) module, which is used to communicate with the Internet in a wireless manner.

The method provided in the embodiment can be applied to the above computer terminal, or called a quantum computer system.

Figure 2:
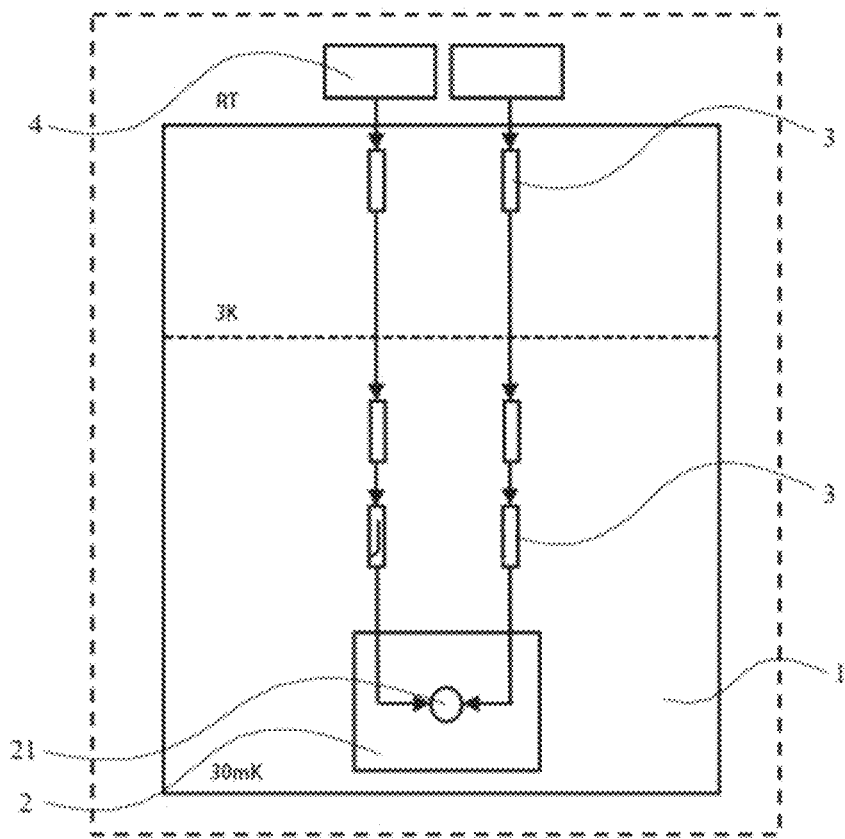
FIG. 2 is a schematic diagram of a low temperature measurement and control circuit of a dilution refrigerator provided by an embodiment of the present application.

Please refer to FIG. 2. In a possible embodiment, in a quantum computer system, a plurality of qubits 21 (one qubit 21 is taken as an example in the FIG. 2) are integrated on a quantum chip 2, and each of the qubits 21 is coupled with an XY signal transmission line for receiving a quantum state control signal and a Z signal transmission line for receiving a qubit frequency control signal. The XY signal transmission line and the Z signal transmission line are respectively led out to room temperature through the low-temperature circuit of the dilution refrigerator 1, and then a line connected with the corresponding hardware device 4 is built at the room temperature end. Because of the different lengths of their corresponding lines and the addition of different microwave devices 3 on the lines, the transmission delays of signals on different lines are different, so that different control signals cannot reach the quantum chip 2 according to the designed time sequence, which affects the accuracy of controlling the quantum states of the qubits 21.

The present application provides a calibration method and a calibration apparatus for the delay of a quantum computer system. First, the total delay of different lines is obtained through experimental results, then the relative delays of different lines (that is, the transmission delays of different lines) are calculated according to the total delay, and finally, delay calibration is performed for the lines according to the relative delays, so that the transmission delays caused by different lengths of lines and the addition of different microwave devices on the lines are eliminated, so that the control signals on different lines can reach the quantum chip according to the designed time sequence, thus realizing a precise control of quantum state.

Figure 3:
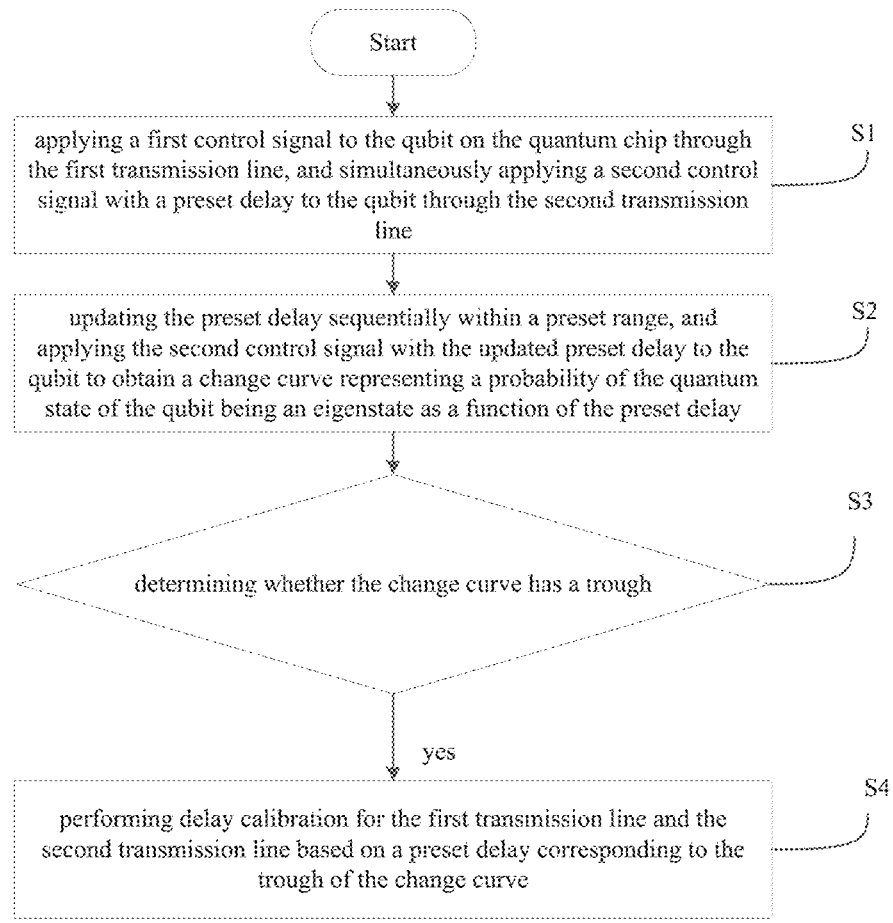
FIG. 3 is a schematic flow diagram of a calibration method for a delay of a computer system provided by an embodiment of the present application.

Therefore, the present application provides a calibration method for a delay of a quantum computer system, comprising a quantum chip and a first transmission line and a second transmission line connecting a qubit on the quantum chip. Referring to FIG. 3, the calibration method comprises:

S1, applying a first control signal to the qubit on the quantum chip through the first transmission line, and simultaneously applying a second control signal with a preset delay to the qubit through the second transmission line; wherein the first control signal is to control a quantum state of the qubit to an eigenstate, the second control signal is to control a frequency of the qubit, and a change of the frequency of the qubit affects a probability of the quantum state being an eigenstate.

Specifically, in an embodiment of the present invention, the first transmission line can be used to represent the XY signal transmission line for receiving quantum state control signals, and the second transmission line can be used to represent the Z signal transmission line for receiving qubit frequency control signals. The first control signal is a quantum state control signal, and the second control signal is a qubit frequency control signal. Specifically, the signal sources of the first control signal and the second control signal are hardware devices located at the room temperature layer outside the dilution refrigerator, comprising but not limited to vector network analyzer, RF signal generator, etc.

The first control signal enters the qubit on the quantum chip from one end of the first transmission line for exciting the qubit and controlling the quantum state of the qubit. Specifically, the quantum state of a qubit comprises two eigenstates, i.e., |0⟩ state and |1⟩ state. In this embodiment, in practice, a π-pulse qubit control signal is applied through the first transmission line, that is, the first control signal is a π-pulse qubit control signal, which is used to control the quantum state of a qubit to |1⟩ state. At this time, the probability of the quantum state of a qubit being |1⟩ state is 1 or a probability value approaching 1.

The second control signal with the preset delay enters from one end of the second transmission line and acts on the qubit with the first control signal applied on the quantum chip to control the frequency of the qubit.

It should be noted that the frequency of the qubit refers to the energy level transition frequency between the ground state (i.e. |0⟩ state) and the excited state (i.e. |1⟩ state) of the qubit. When the frequency of the first control signal is equal to or close to the frequency of the qubit, the qubit and the first control signal produce a resonance effect, so that the quantum state of the qubit can be controlled by applying the first control signal through the first transmission line. When the frequency of the qubit is very different from the frequency of the first control signal, the quantum state of the qubit will not respond to the first control signal, that is, the quantum state of the qubit cannot be controlled by applying the first control signal through the first transmission line. In this embodiment, the second control signal applied to the qubit will control the frequency of the qubit, which will further affect the control effect of the first control signal on the quantum state of the qubit, that is, as the frequency of the qubit changes, the probability of the quantum state being an eigenstate will also change.

S2, updating the preset delay sequentially within a preset range, and applying the second control signal with the updated preset delay to the qubit to obtain a change curve representing a probability of the quantum state of the qubit being an eigenstate as a function of the preset delay; wherein the preset range is set according to lengths of the first transmission line and the second transmission line.

Specifically, in a possible embodiment, the preset delay is sequentially updated in increments of 0.5 ns, each step is incremented once, the second control signal with the updated preset delay is applied to the qubit, and data information that the probability of the quantum state of the qubit being an eigenstate as a function of the preset delay is measured one, and then all data information is plotted as a change curve representing a probability of the quantum state of the qubit being an eigenstate as a function of the preset delay, with the preset delay as the horizontal axis and the probability of the quantum state of the qubit as the vertical axis.

In another possible embodiment, the preset delay is sequentially updated in increments of a dynamic step size within a preset range. In an initial state, the dynamic step size is a preset step size, such as 0.5 ns, 0.7 ns, 1 ns, etc. Each step is incremented once, the second control signal with the updated preset delay is applied to the qubit, the data information of the probability of the quantum state of the qubit being an eigenstate as a function of the preset delay is measured once, and the dynamic step size is dynamically adjusted according to the extent of the probability changes with the preset time delay, wherein if the probability changes greatly with the preset time duration, the dynamic step size will be reduced accordingly; otherwise, if the probability changes slightly with the preset time duration, the dynamic step size will be increased.

The preset range is set according to the lengths of the first transmission line and the second transmission line, so as to ensure that the preset delay takes a value within the preset range, and all effective data information can be obtained, so that the change curve is complete.

S3, determining whether the change curve has a trough, and if the change curve has a trough, performing S4.

Figure 4:
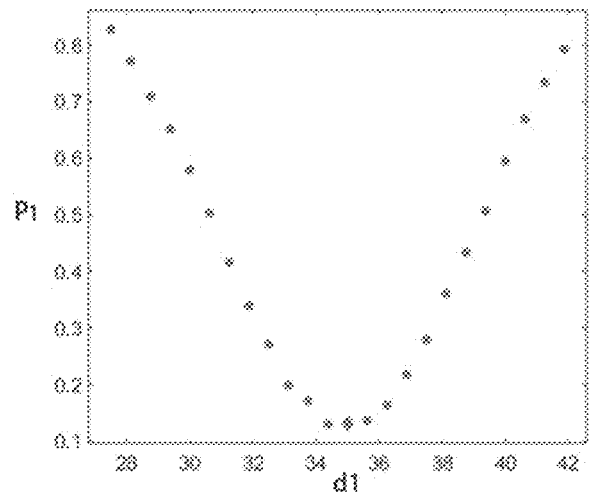
FIG. 4 is a change curve representing a probability of the quantum state of the qubit being an eigenstate as a function of a preset delay according to an embodiment of the present application.

Specifically, in a possible embodiment, a change curve as shown in FIG. 4 is obtained after the preset delay is updated for many times, it can be directly seen from FIG. 4 whether the change curve has a trough. The actual situation presented at the trough is that the second control signal with a preset delay corresponding to this point is applied to the second control line. At this time, when the first control signal and the second control signal are transmitted to the qubit through the first transmission line and the second transmission line respectively, the waveform center of the first control signal is aligned with the waveform center of the second control signal. As mentioned above, when the frequency of the qubit changes, the quantum state of the qubit will change correspondingly. When the waveform center of the first control signal is aligned with the waveform center of the second control signal, that is, the second control signal applied on the second transmission line will adjust the frequency of the qubit to deviate from the target operating point by the maximum frequency. At this time, the first control signal applied on the first transmission line has the worst control effect on the quantum state of the qubit, showing that the first control signal has the worst control effect on the qubit.

Specifically, in a possible embodiment, whether the change curve has a trough can be continuously determined in the process of dynamically updating the preset delay. For example, if the probability of the qubit being a quantum state measured after the corresponding preset delay is applied to the second control line for the n-th time is less than the probability of the qubit being a quantum state measured after the corresponding preset delay is applied to the second control line for the (n−1)-th time, and the probability of the qubit being a quantum state measured after the corresponding preset delay is applied to the second control line for the n-th time is less than the probability of the qubit being a quantum state measured after the corresponding preset delay is applied to the second control line for the (n+1)-th time, it can be determined that the preset delay applied on the second control line for the n-th time is the trough position of the change curve.

S4, performing delay calibration for the first transmission line and the second transmission line based on a preset delay corresponding to the trough of the change curve.

It can be understood that in the embodiment of the present application, during the process of experimental testing, the trough of the change curve presents the worst control effect, which can reflect the real transmission time difference of signal transmission between the first transmission line and the second transmission line. Based on this, in an actual delay calibration process of the quantum computer system, performing delay calibration for the first transmission line and the second transmission line by using the preset delay corresponding to the trough of the change curve, can make that the first control signal on the first transmission line and the second control signal on the second transmission line reach the qubit synchronously, which makes the first control signal have the best control effect on the qubit.

Specifically, the preset delay corresponding to the trough of the change curve is preferred. It is not difficult to understand that the preset delay is the total delay of the second transmission line. Since there is no preset delay on the first transmission line, the relative delays of different lines (that is, the transmission delays of different lines) are calculated according to the total delay, and finally, delay calibration can be performed for the lines according to the relative delays, so that the real transmission delays caused by different lengths of lines and the addition of different microwave devices on the lines are eliminated, so that the control signals on different lines can reach the quantum chip according to the designed time sequence, thus realizing a precise control of quantum state.

Figure 5:
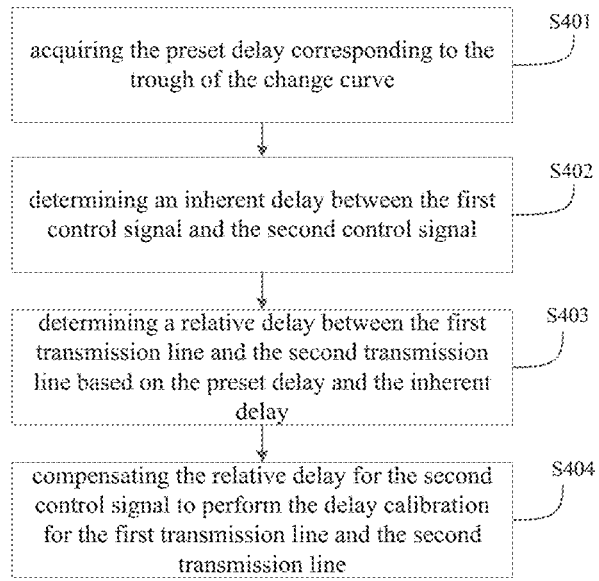
FIG. 5 is a schematic flow diagram of a method for performing delay calibration for a first transmission line and a second transmission line based on a preset delay corresponding to a trough of the change curve according to an embodiment of the present application.

For example, referring to FIG. 5, performing delay calibration for the first transmission line and the second transmission line based on a preset delay corresponding to the trough of the change curve specifically comprises:

S401. acquiring the preset delay corresponding to the trough of the change curve.

Specifically, the preset delay corresponding to the trough of the change curve can be seen intuitively from the change curve shown in FIG. 4 obtained by simulation of measurement data. Or, the preset delay corresponding to the trough of the change curve can be determined by dynamically determining the probability obtained by the n-th measurement, the probability obtained by the (n−1)-th measurement and the probability obtained by the (n+1)-th measurement.

S402, determining an inherent delay between the first control signal and the second control signal;

Specifically, since the inherent delay between the first control line signal and the second control signal is the delay caused by the different wavelength period of the first control signal and the wavelength period of the second control signal, let the inherent delay be d2, and $d2=|T1/2-T2/2|$. $T1$ is a wavelength period of the first control signal and $T2$ is a wavelength period of the second control signal.

S403, determining a relative delay between the first transmission line and the second transmission line based on the preset delay and the inherent delay;

It can be understood that if only by delaying the second control signal, the change curve with a trough can be obtained, which means that the transmission speed of the second transmission line is greater than or equal to that of the first transmission line. In the subsequent delay calibration, it is only necessary to compensate the relative delay in the second control signal. Determining a relative delay between the first transmission line and the second transmission line based on the preset delay and the inherent delay, specifically comprises the following two situations:

if $T1>T2$, determining the relative delay to be a difference between the preset delay and the inherent delay, that is, $d3=d1-d2$.

if $T1<T2$, determining the relative delay to be a sum of the preset delay and the inherent delay, that is, $d3=d1+d2$.

$d3$ is the relative delay, $d1$ is the preset delay and $d2$ is the inherent delay.

S404, compensating the relative delay for the second control signal to perform the delay calibration for the first transmission line and the second transmission line.

Specifically, in practical applications, in a possible embodiment, the relative delay is compensated for the second control signal at the initial moment, and the relative delay is a null signal that does not carry information, which is used to eliminate the transmission delay between the first transmission line and the second transmission line, and calibrate the delay between the first transmission line and the second transmission line.

In another possible embodiment, the relative delay is compensated for the second control signal at the initial moment, it means that it is controlled to stop sending the second control signal to the second transmission line within the time corresponding to the relative delay, and start sending the second control signal to the second transmission line when the time corresponding to the relative delay ends.

Figure 6:
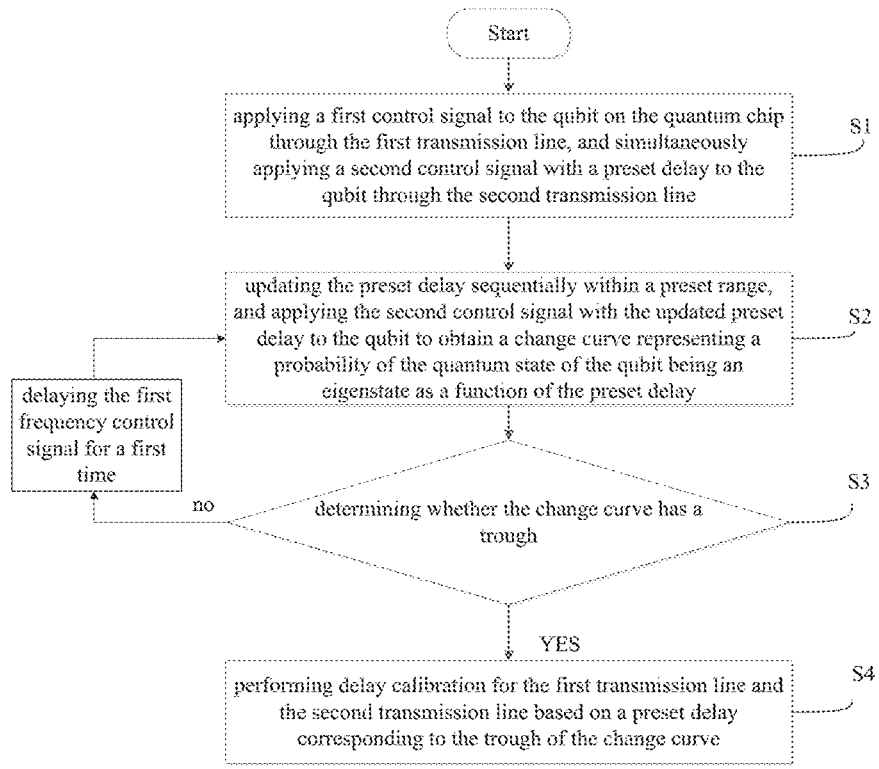
FIG. 6 is a schematic flow diagram of another calibration method for a delay of a computer system provided by an embodiment of the present application.

For example, referring to FIG. 6, determining whether the change curve has a trough further comprises:

if the change curve does not have a trough, delaying the first frequency control signal by a first time, and returning to perform S2.

Specifically, if a change curve with a trough cannot be obtained only by delaying the second control signal, it means that the transmission speed of the second transmission line is lower than that of the first transmission line, and at this time, the first control signal needs to be delayed by the first time with a certain length, so as to ensure the implementability of the subsequent solution.

Figure 7:
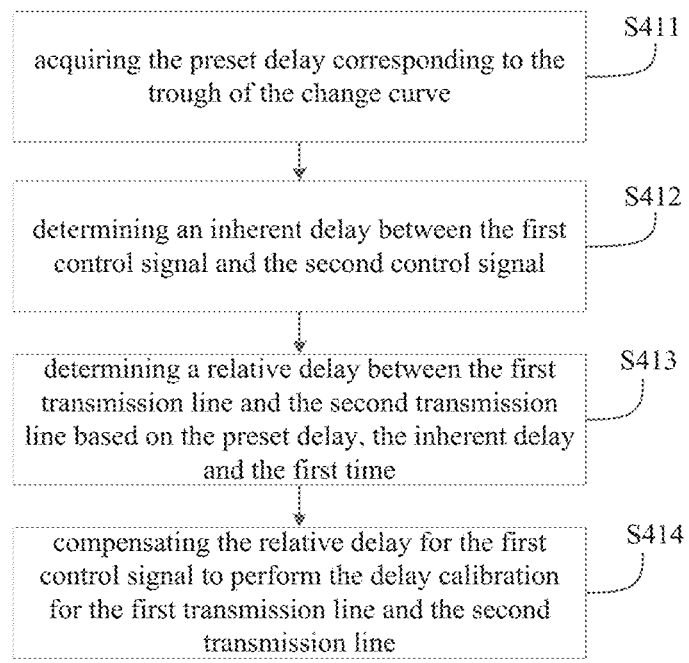
FIG. 7 is a schematic flow diagram of a method for performing delay calibration for a first transmission line and a second transmission line based on a preset delay corresponding to a trough of the change curve when the change curve has a trough after a first control signal is delayed by a first time according to an embodiment of the present application.

For example, referring to FIG. 7, when the change curve has the trough after the first control signal is delayed by the first time, performing delay calibration for the first transmission line and the second transmission line based on a preset delay corresponding to the trough of the change curve, specifically comprises:

S411, acquiring the preset delay corresponding to the trough of the change curve.

Specifically, the preset delay corresponding to the trough of the change curve can be seen intuitively from the change curve shown in FIG. 4 obtained by simulation of measurement data. Or, the preset delay corresponding to the trough of the change curve can be determined by dynamically determining the probability obtained by the n-th measurement, the probability obtained by the (n−1)-th measurement and the probability obtained by the (n+1)-th measurement.

S412, determining an inherent delay between the first control signal and the second control signal;

Specifically, the inherent delay of the first control line signal and the second control signal is the delay caused by the different wavelength periods of the two control signals, let the inherent delay be d2, and d2=|T1/2−T2/2|.

S413, determining a relative delay between the first transmission line and the second transmission line based on the preset delay, the inherent delay and the first time.

It can be understood that if the change curve with a trough cannot be obtained only by delaying the second control signal, the change curve with a trough can be obtained only after the first control signal is delayed by the first time, which means that the transmission speed of the second transmission line is lower than that of the first transmission line, and the relative delay needs to be compensated for the first control signal in the subsequent delay calibration. Determining a relative delay between the first transmission line and the second transmission line based on the preset delay, the inherent delay and the first time, specifically comprises the following two situations:

if $T>T2$, then $d3=d-d1-d2$.

if $T1<T2$, then $d3=d-d1+d2$.

d3 is the relative delay, d is the first time, d1 is the preset delay and d2 is the inherent delay. The first time d can be a time with a preset length according to actual experience, and the first time d can also be the time difference between a time when the first control signal reaches the qubit and a time when the second control signal reaches the qubit, actually measured by the measuring instrument.

S414, compensating the relative delay for the first control signal to perform the delay calibration for the first transmission line and the second transmission line.

Specifically, in practical applications, in a possible embodiment, the relative delay is compensated for the first control signal at the initial moment, and the relative delay is a null signal that does not carry information, which is used to eliminate the transmission delay between the first transmission line and the second transmission line, and calibrate the delay between the first transmission line and the second transmission line.

Or, in another possible embodiment, the relative delay is compensated for the first control signal at the initial moment can be controlling the first transmission line to stop sending the first control signal within the time corresponding to the relative delay, and controlling the first transmission line to send the first control signal to the qubit when the time corresponding to the relative delay ends.

Exemplarily, before applying a first control signal to the qubit on the quantum chip through the first transmission line, and simultaneously applying a second control signal with a preset delay to the qubit through the second transmission line, the method further comprises:
  determining an inherent delay between the first control signal and the second control signal; Specifically, the inherent delay of the first control line signal and the second control signal is the delay caused by the different wavelength periods of the two control signals, let the inherent delay be d2, and d2=|T1/2−T2/2|.
  if T1>T2, delaying the second control signal by the inherent delay, so that a center of a waveform of the first control signal and a center of a waveform of the second control signal are aligned.
  if T1<T2, delaying the first control signal by the inherent delay, so that a center of a waveform of the first control signal and a center of a waveform of the second control signal are aligned.

In this way, in the delay calibration experiment, the inherent delay between the first control signal and the second control signal is eliminated by the above steps, so that the preset delay in the experiment does not comprise the inherent delay, which is more convenient for the subsequent calculation of the relative delay.

Figure 8:
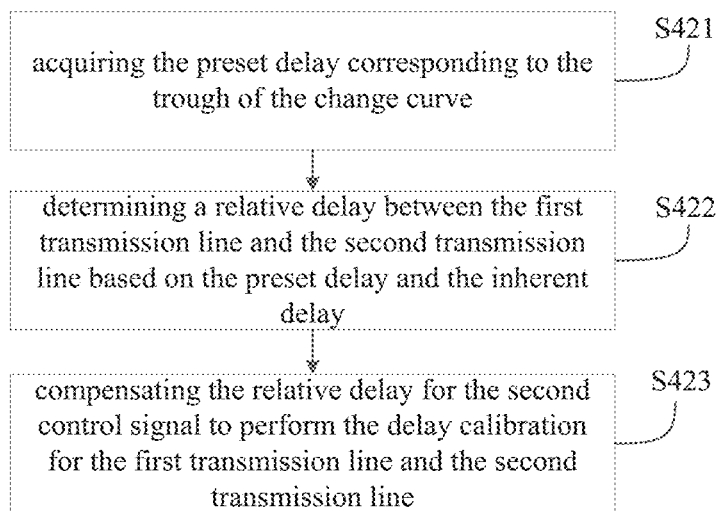
FIG. 8 is a schematic flow diagram of another method for performing delay calibration for a first transmission line and a second transmission line based on a preset delay corresponding to a trough of the change curve according to an embodiment of the present application.

For example, referring to FIG. 8, performing delay calibration for the first transmission line and the second transmission line based on a preset delay corresponding to the trough of the change curve specifically comprises:

S421, acquiring the preset delay corresponding to the trough of the change curve.

Specifically, the preset delay corresponding to the trough of the change curve can be seen intuitively from the change curve shown in FIG. 4 obtained by simulation of measurement data. Or, the preset delay corresponding to the trough of the change curve can be determined by dynamically determining the probability obtained by the n-th measurement, the probability obtained by the (n−1)-th measurement and the probability obtained by the (n+1)-th measurement.

S422, determining a relative delay between the first transmission line and the second transmission line based on the preset delay and the inherent delay;

It can be understood that if the change curve with a trough can be obtained only by delaying the second control signal, which means that the transmission speed of the second transmission line is greater than or equal to that of the first transmission line. In the subsequent delay calibration, it is only necessary to compensate the relative delay for the second control signal. Determining a relative delay between the first transmission line and the second transmission line based on the preset delay and the inherent delay, specifically comprises the following two situations:
  if T1>T2, determining the relative delay to be equal to the preset delay, that is, d3=d1.
  if T1<T2, determining the relative delay to be equal to a sum of the preset delay and the inherent delay, that is, d3=d1+d2.
  d3 is the relative delay, d1 is the preset delay and d2 is the inherent delay.

S423, compensating the relative delay for the second control signal to perform the delay calibration for the first transmission line and the second transmission line.

Specifically, referring to the aforementioned S404, in practical applications, the relative delay is compensated for the second control signal at the initial moment, and the relative delay is a null signal that does not carry information, which is used to eliminate the transmission delay between the first transmission line and the second transmission line and calibrate the delay between the first transmission line and the second transmission line.

For example, referring to FIG. 6, determining whether the change curve has a trough further comprises:
  if the change curve does not have a trough, delaying the first frequency control signal by the first time, and returning to perform S2.

Specifically, if the change curve with a trough cannot be obtained only by delaying the second control signal, it means that the transmission speed of the second transmission line is lower than that of the first transmission line, and at this time, the first control signal needs to be delayed by the first time with a certain length, so as to ensure the implementability of the subsequent solution.

Figure 9:
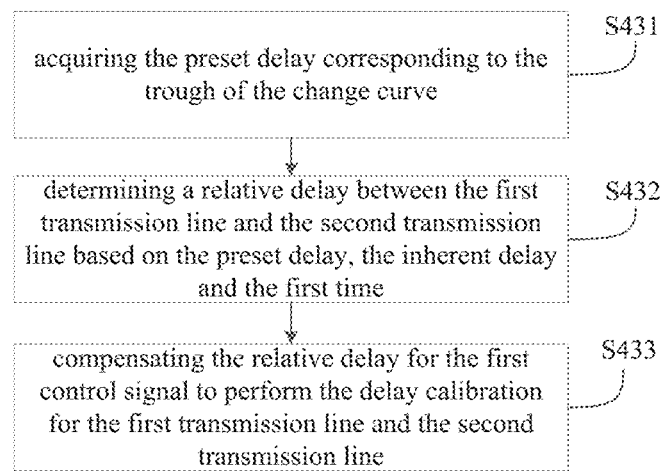
FIG. 9 is a schematic flow diagram of another method for performing delay calibration for a first transmission line and a second transmission line based on a preset delay corresponding to a trough of the change curve when the change curve has a trough after the first control signal is delayed by the first time according to an embodiment of the present application.

For example, referring to FIG. 9, when the change curve has the trough after the first control signal is delayed by the first time, performing delay calibration for the first transmission line and the second transmission line based on a preset delay corresponding to the trough of the change curve, specifically comprises:

S431, acquiring the preset delay corresponding to the trough of the change curve.

Specifically, the preset delay corresponding to the trough of the change curve can be intuitively seen from FIG. 4.

S432, determining a relative delay between the first transmission line and the second transmission line based on the preset delay, the inherent delay and the first time.

It can be understood that if the change curve with a trough cannot be obtained only by delaying the second control signal, the change curve with a trough can be obtained only after the first control signal is delayed by the first time, which means that the transmission speed of the second transmission line is lower than that of the first transmission line, and the relative delay needs to be compensated for the first control signal in the subsequent delay calibration. Determining a relative delay between the first transmission line and the second transmission line based on the preset delay, the inherent delay and the first time, specifically comprises the following two situations:

if $T1>T2$, then $d3=d-d1$.

if $T1<T2$, then $d3=d+d2-d1$.

d3 is the relative delay, d is the first time, d1 is the preset delay and d2 is the inherent delay.

S433, compensating the relative delay for the first control signal to perform the delay calibration for the first transmission line and the second transmission line.

Specifically, referring to the aforementioned S414, in practical applications, the relative delay is compensated for the first control signal at the initial moment, and the relative delay is a null signal that does not carry information, which is used to eliminate the transmission delay of the first transmission line and the second transmission line and perform delay calibration for the first transmission line and the second transmission line.

Figure 10:
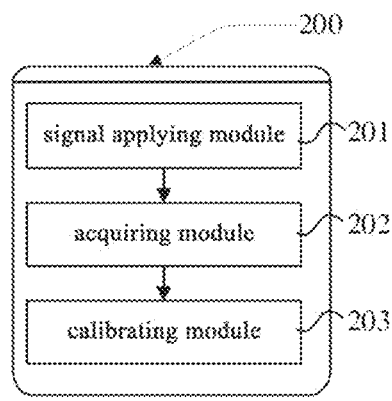
FIG. 10 is a schematic diagram of a structure of a calibration apparatus for a delay of a computer system provided by an embodiment of the present application.

Based on the same inventive concept, an embodiment also provides a calibration apparatus for a delay of a quantum computer system. Please refer to FIG. 10. The calibration apparatus 200 mainly comprises a signal applying module 201, an acquiring module 202 and a calibrating module 203.

The signal applying module 201 is configured for applying a first control signal to a qubit on a quantum chip through a first transmission line, and simultaneously applying a second control signal with a preset delay to the qubit through a second transmission line; wherein the first control signal is to control a quantum state of the qubit to an eigenstate, the second control signal is to control a frequency of the qubit, and a change of the frequency of the qubit affects a probability of the quantum state being an eigenstate.

The acquiring module 202 is configured for updating the preset delay sequentially within a preset range, and applying a second control signal with the updated preset delay to the qubit to obtain a change curve representing a probability of the quantum state of the qubit being an eigenstate as a function of the preset delay; wherein the preset range is set according to lengths of the first transmission line and the second transmission line.

The calibrating module 203 is configured for determining whether the change curve has a trough; and for performing delay calibration for the first transmission line and the second transmission line based on a preset delay corresponding to the trough of the change curve.

Based on the same inventive concept, an embodiment also provides a quantum computer system, comprising a quantum chip, a first transmission line and a second transmission line connecting a qubit on the quantum chip, and the calibration apparatus for a delay of the quantum computer system as stated above, wherein the calibration apparatus for the delay of the quantum computer system is connected with the first transmission line and the second transmission line for implementing the calibration method for a delay of the quantum computer system as stated above.

To sum up, in the present application, first, the total delay of different lines is obtained through experimental results, then the relative delays of different lines (that is, the transmission delays of different lines) are calculated according to the total delay, and finally, delay calibration is performed for the lines according to the relative delays, so that the transmission delays caused by different lengths of lines and the addition of different microwave devices on the lines are eliminated, so that the control signals on different lines can reach the quantum chip according to the designed time sequence, thus realizing a precise control of quantum state.

Figure 11:
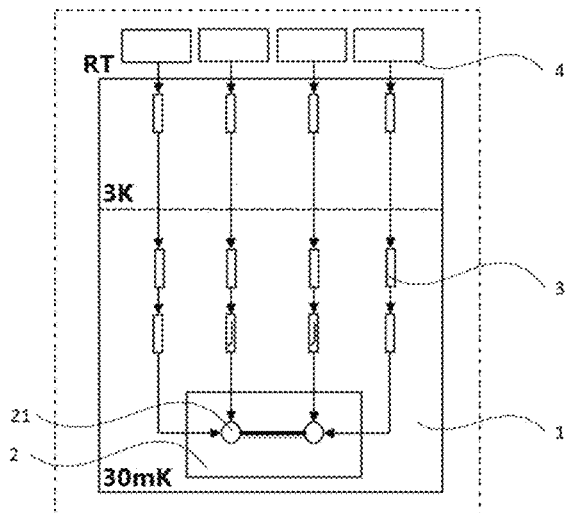
FIG. 11 is a schematic diagram of a low temperature measurement and control circuit of a dilution refrigerator provided by an embodiment of the present application.

Please refer to FIG. 11, in a possible embodiment, in a quantum computer system, a plurality of qubits 21 (two qubits 21 are taken as an example in the FIG. 2) coupled with each other are integrated on a quantum chip 2, and each of the qubits 21 is coupled with an XY signal transmission line for receiving a quantum state control signal and a Z signal transmission line for receiving a qubit frequency control signal. The XY signal transmission line and the Z signal transmission line are respectively led out to room temperature through the low-temperature circuit of the dilution refrigerator 1, and then a line connected with the corresponding hardware device 4 is built at the room temperature end. In the two-bit experiment, the frequency of the corresponding qubit is generally adjusted by applying a qubit frequency control signal on the Z signal transmission line to make it resonate with another qubit, so as to realize the two-qubit gate. However, there are many kinds of microwave devices on the Z signal transmission line, and the lengths of different Z signal transmission lines cannot be guaranteed to be completely equal, which makes the transmission delays on different Z signal transmission lines different, thus leading to different control signals not reaching their corresponding qubits according to the designed time sequence, which will seriously affect the control accuracy of the two qubit gates.

On the other hand, in a possible embodiment, the present application provides a calibration method, a calibration apparatus for a delay of a quantum computer system and a quantum computer. Firstly, the first amplitude and the second amplitude of the frequency control signal applied to the frequency control signal transmission lines of two qubits are acquired through a resonance experiment on two qubits coupled with each other. Then, on this basis, a quantum state oscillation experiment is performed on two qubits to acquire the first width of the frequency control signals applied to the two qubits. Finally, on this basis, after the two qubits are controlled to the state with the maximum coupling strength and the probability of their quantum states being an excited state or a ground state most sensitively over time, the calibration experiment is carried out on the two qubits to eliminate the transmission delay on the transmission lines of different frequency control signals, so that the frequency control signals on the transmission lines of different frequency control signals can reach the quantum chip according to the designed time sequence, thus improving the control accuracy of the two qubit gates.

Figure 12:
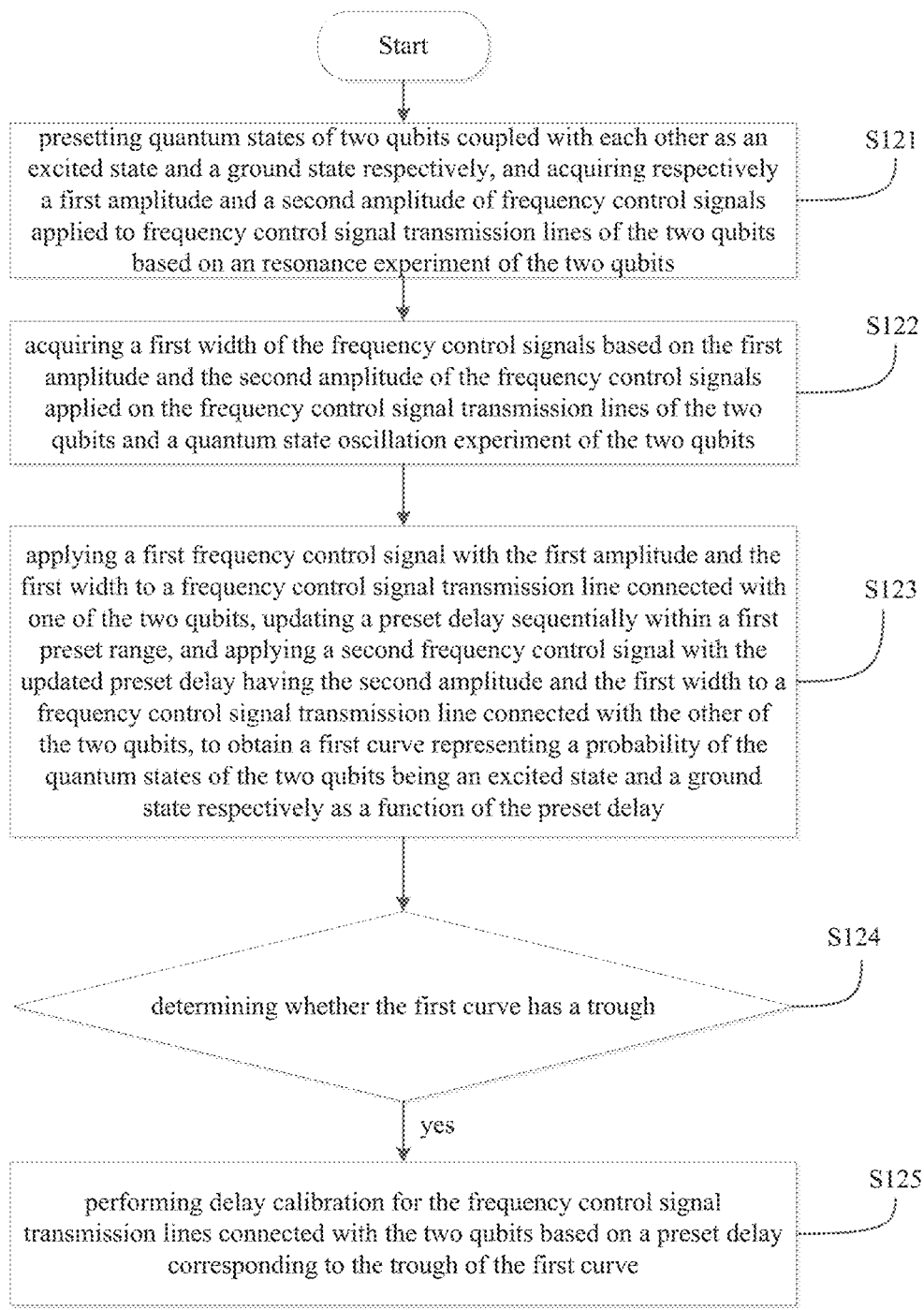
FIG. 12 is a schematic flow diagram of a calibration method for a delay of a quantum computer system provided by an embodiment of the present application.

Therefore, the present application provides a calibration method for a delay of a quantum computer system comprising a quantum chip with a plurality of qubits arranged thereon, each of the qubits being connected with a quantum state control signal transmission line and a frequency control signal transmission line. Referring to FIG. 12, the calibration method for the delay of a quantum computer system provided by an embodiment of the present application may comprise:

S121, presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits; wherein the resonance experiment is an experiment for measuring a coupling strength of the two qubits as a function of the amplitudes of the frequency control signals.

Specifically, a n pulse quantum state control signal is applied to a corresponding qubit through a quantum state control signal transmission line for controlling the quantum state of the qubit to an excited state, and applying a unit pulse quantum state control signal to another corresponding qubit coupled with the aforementioned qubit through another quantum state control signal transmission line for controlling the quantum state of the qubit to a ground state. Based on this, the resonance experiment is carried out on two qubits to obtain the first amplitude of the frequency control signal applied to the frequency control signal transmission line of one qubit and the second amplitude of the frequency control signal applied to the frequency control signal transmission line of another qubit when the two qubits resonate and the coupling strength is maximum (the frequencies of the two qubits are equal).

The signal sources of the quantum state control signal and frequency control signal are provided by hardware devices located at the room temperature layer outside the dilution refrigerator, comprising but not limited to vector network analyzer, RF signal generator, etc.

It should be noted that the frequency adjustment of two qubits coupled with each other will affect the quantum state of the qubit. Specifically, when the frequencies of the two qubits are adjusted to be equal, the coupling strength of the two qubits reaches the maximum. At this time, the quantum states of the two qubits will be exchanged, that is, one qubit will decay from the excited state to the ground state, and the other qubit will change from the ground state to the excited state. It can be seen that the coupling strength of two qubits will affect the quantum state of two qubits.

Based on this, the embodiment of the present application sets up a resonance experiment according to the experiment of measuring the coupling strength of two qubits as a function of the amplitude of the frequency control signal. The resonance experiment shows that the probability of the quantum states of two qubits being eigenstates (comprising ground state and eigenstate) as a function of the amplitudes of frequency control signals.

S122, acquiring a first width of the frequency control signals based on the first amplitude and the second amplitude of the frequency control signals applied on the frequency control signal transmission lines of the two qubits and a quantum state oscillation experiment of the two qubits; wherein the quantum state oscillation experiment is an experiment for measuring quantum states of the two qubits as a function of the width of the frequency control signals.

Specifically, a frequency control signal with a first amplitude is applied to a corresponding qubit through a frequency control signal transmission line, and a frequency control signal with a second amplitude is applied to another corresponding qubit coupled with the aforementioned qubit through another frequency control signal. From S121, it can be known that under the action of the frequency control signal of the first amplitude and the frequency control signal of the second amplitude, resonance occurs between two qubits coupled with each other, and at this time, the coupling strength between two qubits coupled with each other is the maximum (the frequencies of the two qubits are equal). Based on this, the quantum state oscillation experiment is carried out on two qubits to obtain the first width of the frequency control signals applied to the two qubits when the probability change of the quantum state of the two qubits being an eigenstate during the exchange process is the most sensitive with the change of widths of the frequency control signals.

For example, let the first qubit and the second qubit be two qubits coupled with each other, wherein the frequency control signal transmission line of the first qubit is a Z1 transmission line, and the Z1 transmission line is used to apply a z1 control signal to the first qubit to adjust the frequency of the first qubit. The frequency control signal transmission line of the second qubit is a Z2 transmission line, wherein the Z2 transmission line is used to apply a z2 control signal to the second qubit to adjust the frequency of the second qubit.

Based on this, the z1 control signal with a first amplitude is applied to the first qubit through the Z1 transmission line, and the z2 control signal with a second amplitude is applied to the second qubit through the Z2 transmission line, so that the first qubit can resonate with the second qubit. When the first qubit resonates with the second qubit, the quantum state oscillation experiment is carried out on the two qubits, so as to obtain that the probability change of the quantum states of the first qubit and the second qubit being eigenstates with the widths of the z1 control signal and the z2 control signal.

It should be noted that the widths of the frequency control signals applied to the two qubits are equal and change synchronously all along, that is, the durations of the frequency control signals applied to the two qubits are equal and change synchronously.

S123, applying a first frequency control signal with the first amplitude and the first width to a frequency control signal transmission line connected with one of the two qubits, updating a preset delay sequentially within a first preset range, and applying a second frequency control signal with the updated preset delay having the second amplitude and the first width to a frequency control signal transmission line connected with the other of the two qubits, to obtain a first curve representing a probability of the quantum states of the two qubits being an excited state and a ground state respectively as a function of the preset delay.

Specifically, a frequency control signal with a first amplitude and a first width is applied to a corresponding qubit through a frequency control signal transmission line, and the preset delay is updated sequentially within a first preset range, and a frequency control signal with the updated preset delay having a second amplitude and a first width is applied to another corresponding qubit coupled with the aforementioned qubit through another frequency control signal. From S121 and S122, it can be known that two qubits coupled with each other resonate, and the coupling strength is the maximum, and the probability change of the quantum state of the two qubits being an eigenstate is the most sensitive with the change of the durations of the frequency control signals. In this way, when the delay calibration experiment is carried out on two qubits coupled with each other, the experimental results are sensitive to changes in the preset delay, that is, the obtained experimental results are more accurate, which can ensure the experimental accuracy.

More specifically, in an possible embodiment, the preset delay can be updated in a step incremental manner of 1ns within the first preset range, with each step increment once, the frequency control signal with the updated preset delay having the second amplitude and the first width is applied to another corresponding qubit which is coupled with the aforementioned qubit, and the data information that the probability of the quantum states of the two qubits being an excited state and a ground state respectively as a function of the preset delay is measured once, and then all data information is plotted as a first curve with the preset delay as the horizontal axis and the probability of the quantum states of two qubits being an excited state and a ground state respectively as the vertical axis, as shown in FIG. 13.

Or, in another possible embodiment, the preset delay can be updated in a dynamic step manner within the first preset range. For example, the initial dynamic step size can be set, such as 0.5 ns, 0.7 ns, 0.8 ns, etc. And each step increments once, the frequency control signal with the updated preset delay having the second amplitude and the first width is applied to another corresponding qubit which is coupled with the aforementioned qubit, and the data information that the probability of the quantum states of the two qubits being an excited state and a ground state respectively as a function of the preset delay is measured once, and the change of the data information is observed. If the probability changes greatly with the preset delay, the dynamic step size will be reduced accordingly; if the probability changes slightly with the preset delay, the dynamic step size can be increased appropriately.

The first preset range is set according to the lengths of the frequency control signal transmission lines corresponding to the two qubits respectively, so as to ensure that the preset delay takes a value within the first preset range, and all effective data information can be obtained, so that the first change curve is complete.

S124, determining whether the first curve has a trough, and if the first curve has a trough, performing S125.

Specifically, in a possible embodiment, after the preset delay is updated several times, the data of two qubits that the probability as a function of the width of the control signal is counted, and a first curve as shown in FIG. 13 is plotted, from which it can be intuitively seen whether the first curve has a trough. In another possible embodiment, it is also possible to refer to the aforementioned Step S3, and in the process of dynamically updating the preset delay, it is continuously determined whether the change curve has a trough.

The actual situation at the trough is that; after performing the delay calibration of the frequency control signal transmission lines of two qubits based on the preset delay corresponding to this point, when the two frequency control signals are transmitted to the two qubits through their respective corresponding frequency control signal transmission lines, the widths of the waveforms of the two frequency control signals are aligned (that is, the start and end points of the waveforms of the two frequency control signals are aligned).

From the foregoing description, it can be seen that when the waveforms of the frequency control signals of two qubits are aligned (that is, the widths of the frequency control signals of the two qubits are equal, that is, the duration is equal), the interaction between the two qubits coupled with each other is the greatest, and the probability of the quantum state of the two qubits being the eigenstate is the most sensitive with the durations of the frequency control signals, and it shows that the probability of the quantum state of the two qubits being the excited state and the ground state respectively is the lowest and equal, specifically about 50%.

S125, performing delay calibration for the frequency control signal transmission lines connected with the two qubits based on a preset delay corresponding to the trough of the first curve.

It is not difficult to understand that because there is no preset delay on the frequency control signal transmission line of one qubit, the preset delay corresponding to the trough of the first curve is the total delay of the frequency control signal transmission line of another qubit. Based on the total delay, the transmission delay of different frequency control signal transmission lines can be calculated, and finally the delay calibration of frequency control signal transmission lines is performed based on the transmission delay. In this way, the transmission delay caused by various microwave devices and different lengths on different frequency control signal transmission lines can be eliminated, so that different frequency control signals can reach their corresponding qubits according to the designed time sequence, and the control accuracy of the two qubit gates can be improved.

For example, referring to FIG. 14, presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits, specifically comprises:

S11, applying a first quantum state control signal to a first qubit through the quantum state control signal transmission line, and applying a second quantum state control signal to a second qubit coupled with the first qubit through the quantum state control signal transmission line; wherein the first quantum state control signal is to control a quantum state of the first qubit to an excited state, and the second quantum state control signal is to control a quantum state of the second qubit to a ground state.

Specifically, referring to the aforementioned S121, the first quantum state control signal is set as a n pulse quantum state control signal, and the second quantum state is set as a unit pulse quantum state control signal.

S12, applying a second frequency control signal with the second amplitude to the second qubit through the frequency control signal transmission line, wherein the second amplitude is a preset fixed value.

S13, updating an amplitude of the first frequency control signal sequentially within a second preset range, and applying the first frequency control signal with the updated amplitude to the first qubit through the frequency control signal transmission line, to obtain a second curve representing a probability of the quantum state of the first qubit being an excited state as a function of the amplitude of the first frequency control signal.

Specifically, in a possible embodiment, S13 may preset the second amplitude of the second frequency control signal as a fixed value, update the amplitude of the first frequency control signal sequentially in a step incremental manner of 0.01V within the second preset range, and when it is incremented every step, apply the first frequency control signal with the updated amplitude to the first qubit, and measure the data information that the probability of the quantum state of the first qubit being an excited state as a function of the amplitude of the first frequency control signal. Then, the second curve representing a probability of the quantum state of the first qubit being an excited state as a function of the amplitude of the first frequency control signal is plotted as shown in FIG. 15, with the amplitude of the first frequency control signal as the horizontal axis, and the probability of the quantum state of the first qubit being an excited state as the vertical axis.

In another possible embodiment, S13 may also set the second amplitude of the second frequency control signal to a dynamic value, take the dynamic amplitude value within a second preset range, update the amplitude of the first frequency control signal sequentially, and when it is incremented every step, apply the first frequency control signal with the updated amplitude to the first qubit, and measure the data information that the probability of the quantum state of the first qubit being an excited state as a function of the amplitude of the first frequency control signal, and dynamically adjust the set value of the second amplitude according to the measured data information. If the measured data changes greatly, the value of the second amplitude can be reduced. Similarly, if the measured data changes slightly, the value of the second amplitude can be increased accordingly.

S14, acquiring an amplitude corresponding to a trough of the second curve as the first amplitude of the first frequency control signal.

Specifically, whether the second curve has a trough can be intuitively seen from FIG. 15, or whether the second curve has a trough can be determined according to the measured data.

The actual situation at the trough is that when the amplitude of the first frequency control signal applied to the first qubit is the amplitude value corresponding to this point, the first qubit and the second qubit resonate and the coupling strength is the maximum (that is, the frequencies of the first qubit and the second qubit are equal), and the quantum state of the first qubit is most affected by the quantum state of the second qubit, which shows that the probability that the quantum state of the first qubit being an excited state is the lowest.

For example, referring to FIG. 16, acquiring a first width of the frequency control signals based on the first amplitude and the second amplitude of the frequency control signals applied on the frequency control signal transmission lines of the two qubits and a quantum state oscillation experiment of the two qubits, specifically comprises:

S21, applying a first frequency control signal with the first amplitude to the first qubit through the frequency control signal transmission line, and applying a second frequency control signal with the second amplitude to the second qubit through the frequency control signal transmission line.

S22, updating widths of the first frequency control signal and the second frequency control signal sequentially within a third preset range, applying the first frequency control signal with the updated width to the first qubit through the frequency control signal transmission line, and applying the second frequency signal with the updated width to the second qubit through the frequency control signal transmission line; acquiring a third curve and a fourth curve, wherein the third curve represents a probability of the quantum state of the first qubit being an excited state and the quantum state of the second qubit being a ground state as a function of the widths, and the fourth curve represents a probability of the quantum state of the first qubit being a ground state and the quantum state of the second qubit being an excited state as a function of the widths; wherein the widths of the first frequency control signal and the second frequency control signal are always equal and varying synchronously.

Specifically, in a possible embodiment, the widths of the first frequency control signal and the second frequency control signal can be sequentially updated in a step incremental manner of ins within a third preset range, and when it is incremented every step, the first frequency control signal with the updated width is applied to the first qubit through a frequency control signal transmission line, and the second frequency signal is applied to the second qubit through the frequency control signal transmission line, and the data information that the probability of the quantum state of the first qubit being an excited state and the probability of the quantum state of the second qubit being a ground state as a function of the widths is measured, and the data information that the probability of the quantum state of the first qubit being a ground state and the probability of the quantum state of the second qubit being an excited state as a function of the widths is measured. Then, in the same coordinate system, the third curve representing the probability of the quantum state of the first qubit being an excited state and the probability of the quantum state of the second qubit being a ground state as a function of the widths, and the fourth curve representing the probability of the quantum state of the first qubit being a ground state and the quantum state of the second qubit being an excited state as a function of the widths are plotted as shown in FIG. 17, with the width of the first frequency control signal and the second frequency control signal as the horizontal axis, and the probability distribution value as the vertical axis.

In another possible embodiment, reference can be made to the method of sequentially updating the widths of the first frequency control signal and the second frequency control signal in a dynamic step size as described in S123, so as to measure and obtain data information that the probability of the quantum state of the first qubit being an excited state and the probability of the quantum state of the second qubit being a ground state as a function of the widths, and data information that the probability of the quantum state of the first qubit being a ground state and the probability of the quantum state of the second qubit being an excited state as a function of the widths.

It should be noted that in order to ensure the accuracy of the quantum state oscillation experiment, the widths of the first frequency control signal and the second frequency control signal are not equal to 0.

S23, acquiring a width corresponding to an intersection point of the third curve and the fourth curve as the first width of the first frequency control signal and of the second frequency control signal.

Specifically, the intersection of the third curve and the fourth curve can be intuitively seen from FIG. 17, or whether there is an intersection between the third curve and the fourth curve can be determined according to the measured data. The actual situation presented by this intersection is that when the width of the first frequency control signal and the second frequency control signal is the width value corresponding to this intersection, the probability of the quantum state of the first qubit being an excited state is equal to the probability of the quantum state of the second qubit being a ground state, and both are 50%.

In addition, based on the slopes of the third curve and the fourth curve, it can be seen that at this time, the probability change of the quantum states of the first qubit and the second qubit being the eigenstate during the exchange process is the most sensitive with the change of the width of the frequency control signals. Choosing the width corresponding to this point as the width of the first frequency control signal and the second frequency control signal can ensure that the experimental results are sensitive to changes in the preset delay and improve the experimental accuracy.

For example, referring to FIG. 18, acquiring a width corresponding to an intersection point of the third curve and the fourth curve as the first width of the first frequency control signal and of the second frequency control signal, specifically comprises:

S181, acquiring widths corresponding to each of intersection points of the third curve and the fourth curve.
S182, selecting a smallest width among respective widths as the first width.

As the widths of the first frequency control signal and the second frequency control signal increase (that is, the duration of the first frequency control signal and the second frequency control signal increases), the third curve and the fourth curve have a plurality of intersections. In order to ensure the simplicity of the experimental results, the smallest width among the plurality of widths is preferred as the first width.

For example, referring to FIG. 19, performing delay calibration for the frequency control signal transmission lines connected with the two qubits based on a preset delay corresponding to the trough of the first curve, specifically comprises:

S511, acquiring the preset delay corresponding to the trough of the first curve as a target delay.

Specifically, the preset delay corresponding to the trough of the first curve can be intuitively seen from FIG. 13, or the trough of the first curve can be determined according to the measured data, and the preset delay corresponding to the trough of the first curve can be obtained according to the determined trough of the first curve, and this preset delay is set as the target delay.

S512, compensating the target delay for the second frequency control signal to perform the delay calibration for the frequency control signal transmission lines connected with the two qubits.

It can be understood that if the first curve with a trough can be obtained only by delaying the second frequency control signal, it means that the transmission speed of the frequency control signal transmission line of the second qubit is greater than or equal to that of the frequency control signal transmission line of the first qubit, so that the second frequency control signal only needs to be compensated by the corresponding preset delay at the trough of the first curve in the subsequent delay calibration.

Figure 20:
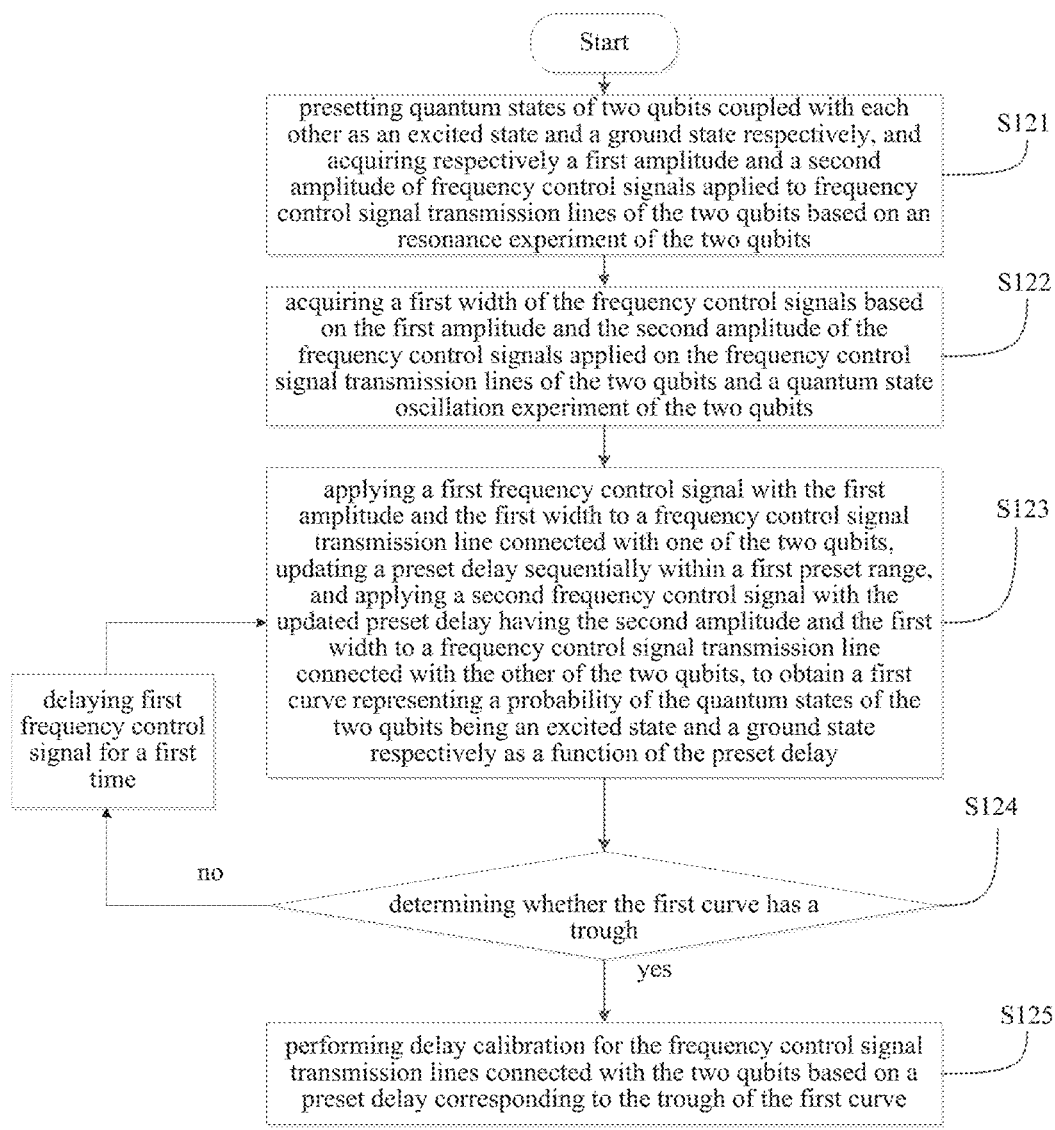
FIG. 20 is a schematic flow diagram of another calibration method for the delay of a quantum computer system provided by an embodiment of the present application.

For example, referring to FIG. 20, determining whether the change curve has a trough further comprises:

if the change curve does not have a trough, delaying the first frequency control signal by the first time, and returning to perform S123.

Specifically, if the first curve having a trough cannot be obtained only by delaying the second frequency control signal, it means that the transmission speed of the frequency control signal transmission line of the second qubit is lower than the transmission speed of the frequency control signal transmission line of the first qubit. At this time, the first frequency control signal needs to be delayed by a first time with a certain length, thus ensuring the feasibility of the subsequent solution. The first time can be a time with a preset length according to actual experience, and the first time can also be the time difference between the time when the second qubit frequency control signal reaches the second qubit and the time when the first qubit frequency control signal reaches the first qubit, actually measured by a measuring instrument.

Figure 21:
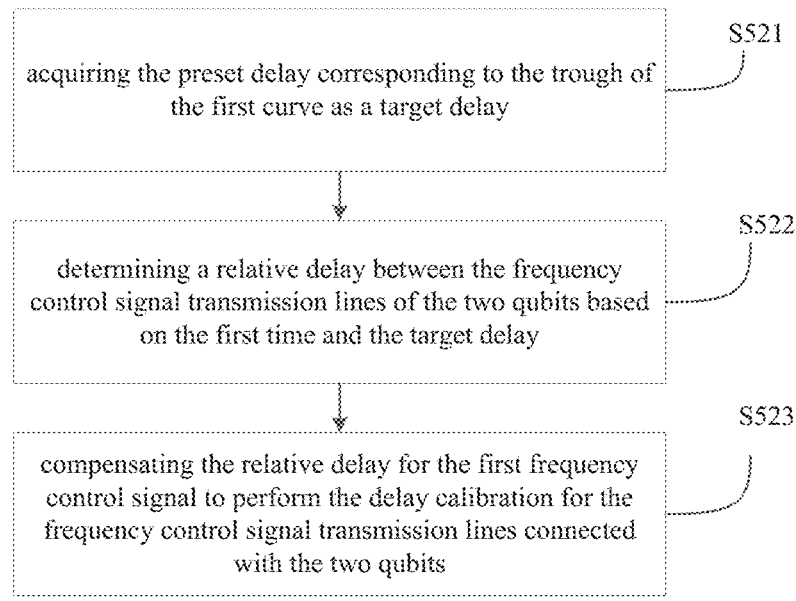
FIG. 21 is a schematic flow diagram of a method for performing delay calibration for the frequency control signal transmission lines connected with two qubits based on a preset delay corresponding to the trough of the first curve when the first curve has a trough after the first frequency control signal is delayed by a first time, provided by an embodiment of the present application.

For example, referring to FIG. 21, when the first curve has a trough after the first frequency control signal is delayed by the first time, performing delay calibration for the frequency control signal transmission lines connected with the two qubits based on a preset delay corresponding to the trough of the first curve, specifically comprises:

S521, acquiring the preset delay corresponding to the trough of the first curve as a target delay.

Specifically, the preset delay corresponding to the trough of the first curve can be intuitively seen from FIG. 13, or the trough of the first curve can be determined according to the measured data, and the preset delay corresponding to the trough of the first curve can be obtained according to the determined trough of the first curve, and this preset delay is set as the target delay.

S522, determining a relative delay between the frequency control signal transmission lines of the two qubits based on the first time and the target delay.

Specifically, the relative delay is an absolute value of the difference between the first time and the target delay.

S523, compensating the relative delay for the first frequency control signal to perform the delay calibration for the frequency control signal transmission lines connected with the two qubits.

It can be understood that if the first curve having a trough cannot be obtained only by delaying the second frequency control signal and the first curve having a trough can be obtained only after the first frequency control signal is delayed by the first time, it means that the transmission speed of the frequency control signal transmission line of the second qubit is lower than the transmission speed of the frequency control signal transmission line of the first qubit, the relative delay needs to be compensated for the first frequency control signal during the subsequent delay calibration.

Figure 22:
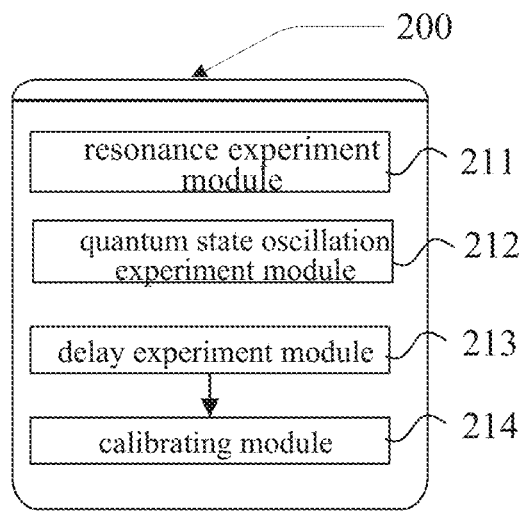
FIG. 22 is a schematic diagram of a structure of a calibration apparatus for the delay of a quantum computer system provided by an embodiment of the present application.

In another aspect, based on the same inventive concept, an embodiment also provides a calibration apparatus for a delay of a quantum computer system. Please refer to FIG. 22. The calibration apparatus 200 mainly comprises a resonance experiment module 211, a quantum state oscillation experiment module 212, a delay experiment module 213 and a calibrating module 214. Wherein, a resonance experiment module 211 is configured for presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits; wherein the resonance experiment is an experiment for measuring a coupling strength of the two qubits as a function of amplitudes of the frequency control signals;

a quantum state oscillation experiment module 212 is configured for acquiring a first width of the frequency control signals based on the first amplitude and the second amplitude of the frequency control signals applied on the frequency control signal transmission lines of the two qubits and a quantum state oscillation experiment of the two qubits; wherein the quantum state oscillation experiment is an experiment for measuring quantum states of the two qubits as a function of the width of the frequency control signals;

a delay experiment module 213 is configured for applying a first frequency control signal with the first amplitude and the first width to a frequency control signal transmission line connected with one of the two qubits, updating a preset delay sequentially within a preset range, and applying a second frequency control signal with the updated preset delay having the second amplitude and the first width to a frequency control signal transmission line connected with the other of the two qubits, to obtain a first curve representing a probability of the two qubits being an excited state and a ground state respectively as a function of the preset delay;

a calibration module 214 is configured for performing, if the first curve has a trough, delay calibration for the frequency control signal transmission lines connected with the two qubits based on a preset delay corresponding to the trough of the first curve.

Based on the same inventive concept, the present embodiment also provides a quantum computer, comprising a quantum chip and the calibration apparatus for a delay of the quantum computer system as stated above, wherein a plurality of qubits coupled with each other are arranged on the quantum chip, and each of the qubits is connected with a quantum state control signal transmission line and a frequency control signal transmission line, and the calibration apparatus for a delay of the quantum computer system is connected with the quantum state control signal transmission line and the frequency control signal transmission line for implementing the calibration method for a delay of the quantum computer system above.

To sum up, the calibration method and the calibration apparatus for a delay of a quantum computer system and the quantum computer provided by the present application have the following advantages that: the transmission delays caused by various microwave devices and different lengths on different frequency control signal transmission lines can be eliminated, so that different frequency control signals can reach their corresponding qubits according to the designed time sequence, and the control accuracy of the two qubit gates can be improved.

In another aspect, in order to improve the control accuracy of two-qubit gate, in a possible embodiment, the present application provides a calibration method and a calibration apparatus for a delay of a quantum computer system and the quantum computer, in which the first delay and the second delay between two quantum state control signal transmission lines (i.e., the XY signal transmission line) and the frequency control signal transmission line (i.e., the Z signal transmission line) connected with the first qubit and the second qubit which are coupled with each other are firstly acquired, then a third delay between frequency control signal transmission lines connected with the first qubit and the second qubit respectively is acquired, and a fourth delay between quantum state control signal transmission lines connected with the first qubit and the second qubit based on the first delay, the second delay and the third delay is finally acquired, and delay calibration is performed based on the fourth delay to eliminate the transmission delays on different quantum state control signal transmission lines, so that the frequency control signals on different quantum state control signal transmission lines can reach their corresponding qubits at the same time according to the designed time sequence, and the corresponding qubits are respectively excited at the same time, thus improving the control accuracy of the two qubit gates.

Figure 23:
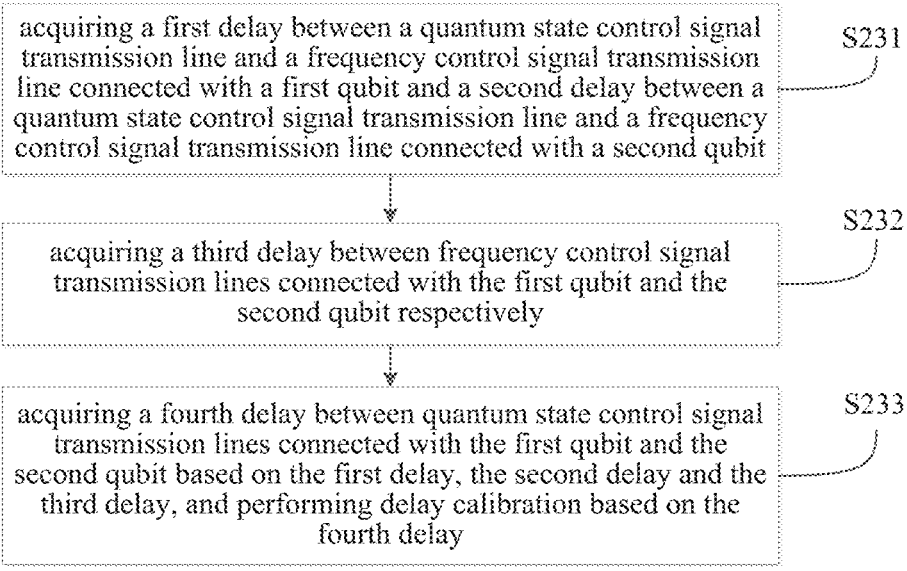
FIG. 23 is a schematic flow diagram of a calibration method for the delay of a quantum computer system provided by an embodiment of the present application.

Therefore, the present application provides a calibration method for a delay of a quantum computer system comprising a quantum chip with a plurality of qubits arranged thereon, each of the qubits being connected with a quantum state control signal transmission line and a frequency control signal transmission line. Referring to FIG. 23, the calibration method comprises the following steps:

S231, acquiring a first delay between a quantum state control signal transmission line and a frequency control signal transmission line connected with a first qubit and a second delay between a quantum state control signal transmission line and a frequency control signal transmission line connected with a second qubit; wherein the first qubit and the second qubit are coupled with each other.

Specifically, due to the influence of quantum state control signal and frequency control signal, the quantum state of qubit will change, and based on the property that the quantum state of qubit changes due to the changes of its quantum state control signal and frequency control signal, the first delay between the quantum state control signal transmission line and the frequency control signal transmission line connected with the first qubit and the second delay between the quantum state control signal transmission line and the frequency control signal transmission line connected with the second qubit can be acquired.

Illustratively, in the first example, it is assumed that the quantum state control signal transmission line of the first qubit is X1, which is used for transmitting the first quantum state control signal x1; the transmission line of the quantum state control signal of the second qubit is X2, which is used for transmitting the second quantum state control signal x2; the frequency control signal transmission line of the first qubit is Z1, which is used for transmitting the frequency control signal z1 of the first qubit, and the frequency control signal transmission line of the second qubit is Z2, which is used for transmitting the frequency control signal z2 of the second qubit. Under the combined action of x1 signal and z1 signal, the quantum state of the first qubit will change, and under the combined action of x2 signal and z2 signal, the quantum state of the second qubit will change. Based on this, the transmission delay between transmission line X1 and transmission line Z1 can be obtained according to the quantum state change of the first qubit, that is, the first delay can be obtained, and the transmission delay between transmission line X2 and transmission line Z2 can be obtained according to the quantum state change of the second qubit, that is, the second delay can be obtained.

S232, acquiring a third delay between frequency control signal transmission lines connected with the first qubit and the second qubit respectively.

Specifically, acquiring the third delay between frequency control signal transmission lines connected with the first qubit and the second qubit respectively based on a representation of a quantum state evolution of two qubits coupled with each other as a function of their quantum state control signals and frequency control signals.

Taking the first example as an example, the third delay is actually the transmission delay between the transmission line Z1 and the transmission line Z2.

S233, acquiring a fourth delay between quantum state control signal transmission lines connected with the first qubit and the second qubit based on the first delay, the second delay and the third delay, and performing delay calibration based on the fourth delay.

Taking the first example as an example, the fourth delay is actually the transmission delay between the transmission line X1 and the transmission line X2.

Specifically, after obtaining the fourth delay, in practical application, in a possible embodiment, a null signal with the duration of the absolute value of the fourth delay can be compensated at the initial moment according to the quantum state control signal on the quantum state control signal transmission line connected with the first qubit or the quantum state control signal transmission line connected with the second qubit, so as to eliminate the transmission delay of the two, and realize the delay calibration between the quantum state control signal transmission line connected with the first qubit and the quantum state control signal transmission line connected with the second qubit.

The above S233 may be to compensate a null signal with the duration of the absolute value of the fourth delay on the signal x1 of the transmission line X1 or compensate a null signal with the duration of the absolute value of the fourth delay on the signal x2 of the transmission line X2 after obtaining the fourth delay between the transmission line X1 and the transmission line X2.

The signal sources of quantum state control signal and frequency control signal are provided by hardware devices located at the room temperature layer outside the dilution refrigerator, comprising but not limited to vector network analyzer, RF signal generator, etc. The quantum state control signal is used to control the quantum state of the corresponding qubit to the quantum state required by the experiment, and the frequency control signal is used to control the frequency of the corresponding qubit.

It should be noted that the first delay in the present embodiment is the delay of the quantum state control signal transmission line connected with the first qubit relative to the frequency control signal transmission line connected with the first qubit; the second delay is the delay of the quantum state control signal transmission line connected with the second qubit relative to the frequency control signal transmission line connected with the second qubit; and the third delay is the delay of the frequency control signal transmission line connected with the first qubit relative to the frequency control signal transmission line connected with the second qubit.

Figure 24A:
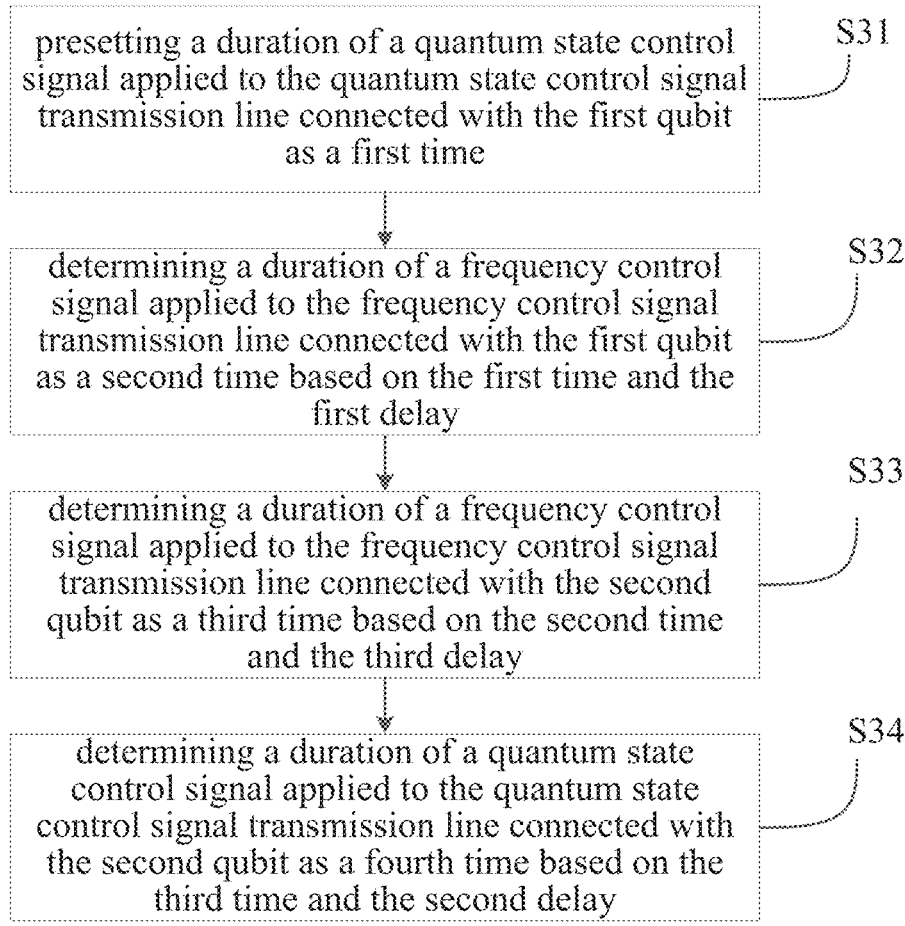
FIG. 24a is a schematic flow diagram of a method for acquiring a fourth delay between the quantum state control signal transmission lines connected with a first qubit and a second qubit based on a first delay, a second delay and a third delay, provided by an embodiment of the present application.
Figure 24B:
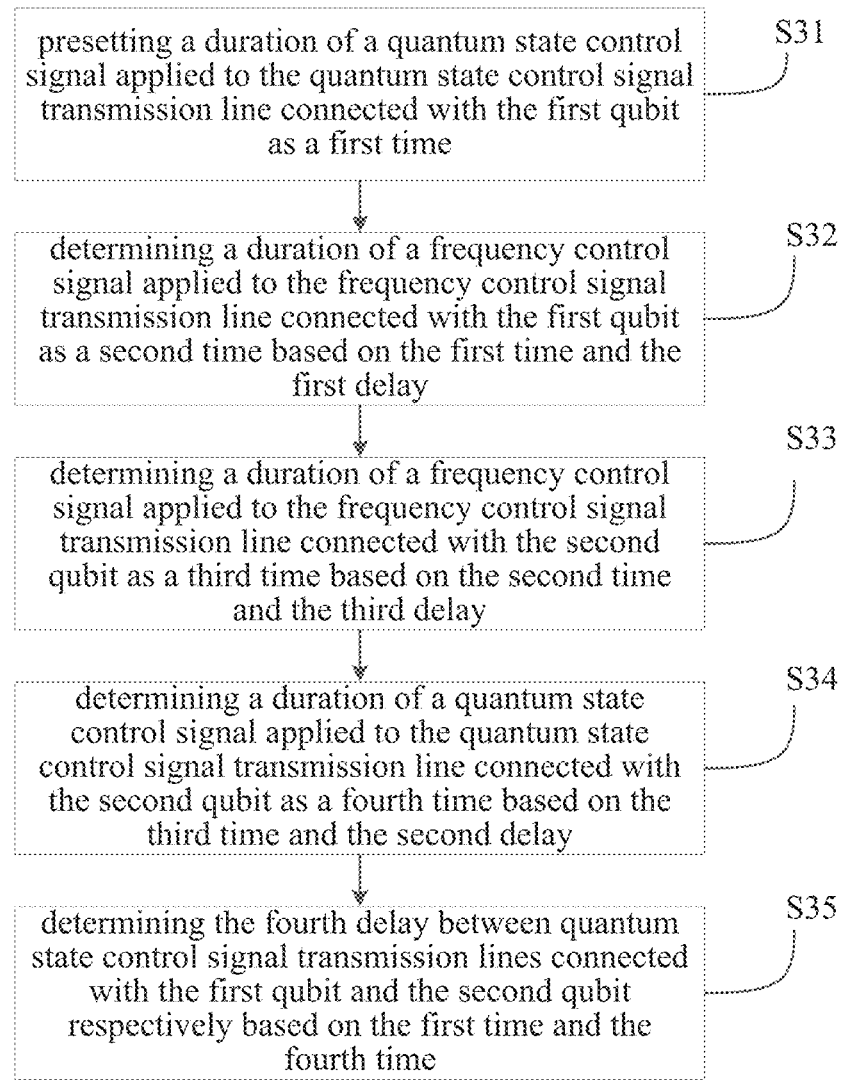
FIG. 24b is a schematic flow diagram of another method for acquiring the fourth delay between the quantum state control signal transmission lines connected with the first qubit and the second qubit based on the first delay, the second delay and the third delay, provided by an embodiment of the present application.

For example, referring to FIGS. 24a and 24b, acquiring a fourth delay between quantum state control signal transmission lines connected with the first qubit and the second qubit based on the first delay, the second delay and the third delay, specifically comprises:

S31, presetting a duration of a quantum state control signal applied to the quantum state control signal transmission line connected with the first qubit as a first time. The value of the first time can be set according to actual experience, or according to the results of historical experimental data, and the specific setting method is not limited in this application.

Specifically, in the present embodiment, the first time is set to 10ns as an example, and the first time is recorded as $T_{XY1}$.

S32, determining a duration of a frequency control signal applied to the frequency control signal transmission line connected with the first qubit as a second time based on the first time and the first delay. Same as the first time, the value of the second time can be set according to actual experience, or according to the results of historical experimental data, and the specific setting method is not limited in this application.

Specifically, let the second time be $T_{Z1}$. For example, the first delay obtained in S1 in the present embodiment is 5 ns, that is, $T_{XY1}-T_{Z1}=5$ ns. It can be obtained that when $T_{XY1}=10$, $T_{Z1}=5$ ns.

S33, determining a duration of a frequency control signal applied to the frequency control signal transmission line connected with the second qubit as a third time based on the second time and the third delay.

Specifically, let the third time be $T_{Z2}$. For example, in the present embodiment, the third delay obtained by S2 is 1ns, that is, $T_{Z1}-T_{Z2}=1$ ns. It can be obtained that when $T_{Z1}=5$ ns, $T_{Z2}=4$ ns.

S34, determining a duration of a quantum state control signal applied to the quantum state control signal transmission line connected with the second qubit as a fourth time based on the third time and the second delay.

Specifically, let the fourth time be $T_{XY2}$. For example, the second delay obtained in S1 in this embodiment is 8 ns, that is, $T_{XY2}-T_{Z2}=8$ ns. It can be obtained that when $T_{Z2}=4$ ns. $T_{XY2}=12$ ns.

S35, determining the fourth delay between quantum state control signal transmission lines connected with the first qubit and the second qubit respectively based on the first time and the fourth time.

Specifically, it can be seen from the above that when $T_{XY1}=10$ ns and $T_{XY2}=12$ ns, $T_{XY1}-T_{XY2}=-2$ ns, that is, the fourth delay is −2 ns, which means that the quantum state control signal on the quantum state control signal transmission line connected with the first qubit reaches the first qubit 2 ns later than that the quantum state control signal on the quantum state control signal transmission line connected with the second qubit.

Figure 25:
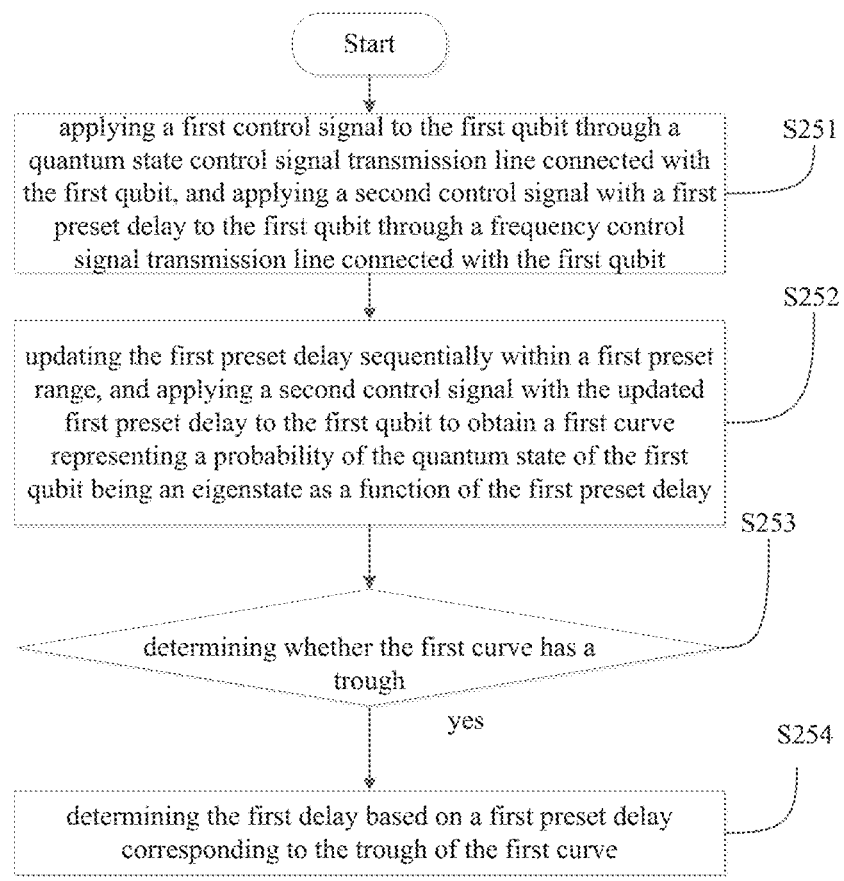
FIG. 25 is a schematic flow diagram of a method for acquiring a first delay between the quantum state control signal transmission line and the frequency control signal transmission line connected with the first qubit based on a representation of a quantum state evolution of the qubit as a function of its quantum state control signal and frequency control signal, provided by an embodiment of the present application.

For example, referring to FIG. 25, acquiring a first delay between the quantum state control signal transmission line and the frequency control signal transmission line connected with the first qubit based on a representation of a quantum state evolution of the qubit as a function of its quantum state control signal and frequency control signal, specifically comprises:

S251, applying a first control signal to the first qubit through a quantum state control signal transmission line connected with the first qubit, and applying a second control signal with a first preset delay to the first qubit through a frequency control signal transmission line connected with the first qubit; wherein, the first control signal is to control a quantum state of the first qubit to an eigenstate, and the second control signal is to control a frequency of the first qubit, and a change of the frequency of the first qubit affects a probability of the quantum state being an eigenstate.

The first control signal enters from one end of a quantum state control signal transmission line connected with the first qubit and acts on the first qubit for exciting the first qubit and controlling the quantum state of the first qubit to an eigenstate. Specifically, the quantum state of the first qubit comprises two eigenstates |0⟩ state and |1⟩ state. In the present embodiment, a π-pulse qubit control signal can be applied through a quantum state control signal transmission line connected with the first qubit, that is, the first control signal is a π-pulse qubit control signal, which is used to control the quantum state of the first qubit to the |1⟩ state. At this time, the probability of the quantum state of the first qubit being the |1⟩ state is 1 or a probability value approaching 1.

The second control signal with preset delay enters the first qubit on the quantum chip to which the first control signal applied from one end of the frequency control signal transmission line connected with the first qubit, and is used to control the frequency of the first qubit.

It should be noted that the frequency of the first qubit refers to the energy level transition frequency between the ground state (i.e. |0⟩ state) and the excited state (i.e. |1⟩ state) of the first qubit. Only when the frequency of the first control signal is equal to or close to the frequency of the first qubit, the first qubit will have a resonance effect with the first control signal. Further, the quantum state of the first qubit can be controlled by applying the first control signal through the quantum state control signal transmission line connected with the first qubit. When the frequency of the first qubit is very different from that of the first control signal, the quantum state of the first qubit will not respond to the first control signal. In the present embodiment, the second control signal applied to the first qubit will control the frequency of the first qubit, which will further affect the control effect of the first control signal on the quantum state of the first qubit, that is, as the frequency of the first qubit changes, the probability of the quantum state being an eigenstate will also change.

S252, updating the first preset delay sequentially within a first preset range, and applying a second control signal with the updated first preset delay to the first qubit to obtain a first curve representing a probability of the quantum state of the first qubit being an eigenstate as a function of the first preset delay; wherein the first preset range is set according to lengths of the quantum state control signal transmission line and the frequency control signal transmission line connected with the first qubit.

Figure 26:
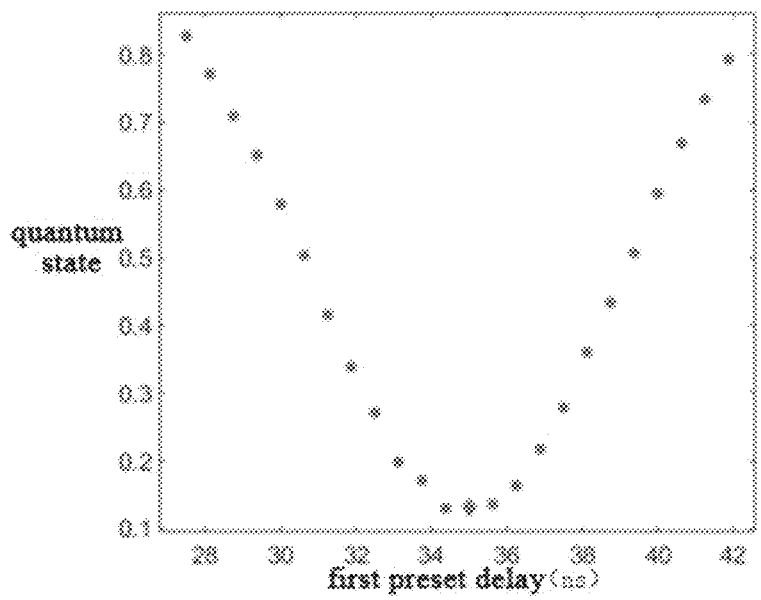
FIG. 26 is a first curve representing the probability of a quantum state of a first qubit being an eigenstate as a function of a first preset delay provided by an embodiment of the present application.

Specifically, in one possible embodiment, the first preset delay can be updated sequentially in a step incremental manner of 0.5 ns within a preset range. And when it is incremented every step, the second control signal with the updated first preset delay is applied to the first qubit, and data information that the probability of the quantum state of the first qubit being an eigenstate as a function of the first preset delay is measured one, and then all data information is plotted as a first curve representing the probability of the quantum state of the first qubit being an eigenstate as a function of the first preset delay as shown in FIG. 26, with the first preset delay as the horizontal axis and the probability of the quantum state of the qubit as the vertical axis.

In another possible embodiment, as described in the aforementioned S2, the first preset delay can be updated sequentially in a dynamic step size, which will not be described here.

The first preset range is set according to lengths of the quantum state control signal transmission line and the frequency control signal transmission line connected with the first qubit, so as to ensure that the first preset delay takes a value within the first preset range, and all effective data information can be obtained, so that the first curve is complete.

S253, determining whether the first curve has a trough, and if the change curve has a trough, performing S254.

Specifically, in one possible embodiment, after the first preset delay is updated for many times, the first curve as shown in FIG. 26 is obtained according to the measurement data, and then it can be intuitively seen from FIG. 26 whether the change curve has a trough. The actual situation presented at the trough is that the second control signal with the preset delay corresponding to this point is applied to the first frequency modulation signal transmission line connected with the first qubit. At this time, when the first control signal and the second control signal are respectively transmitted to the first qubit through the quantum state control signal transmission line and the frequency control signal transmission line connected with the first qubit, the waveform center of the first control signal is aligned with the waveform center of the second control signal. As mentioned above, when the frequency of the first qubit changes, the quantum state of the qubit will change correspondingly. When the waveform center of the first control signal is aligned with the waveform center of the second control signal, that is, the second control signal applied on the frequency control signal transmission line connected with the first qubit will adjust the frequency of the first qubit to deviate from the target operating point by the maximum frequency. At this time, the first control signal applied on the quantum state control signal transmission line connected with the first qubit has the worst effect on controlling the quantum state of the first qubit, which shows that the probability of the quantum state of the first qubit being an eigenstate is the lowest.

In another possible embodiment, it is also possible to refer to the aforementioned S3, and in the process of dynamically updating the preset delay, it is continuously determined whether the first curve has a trough, which is not repeated here.

S254, determining the first delay based on a first preset delay corresponding to the trough of the first curve.

Similarly, according to the above method, the second delay can be obtained.

Exemplary, after determining whether the first curve has a trough, it further comprises:

if the first curve does not have a trough, delaying the first frequency control signal by a first fixed duration, and returning to perform S251.

Specifically, if the change curve having a trough cannot be obtained only by delaying the second control signal, it means that the transmission speed of the frequency control signal transmission line connected with the first qubit is lower than the transmission speed of the quantum state control signal transmission line connected with the first qubit. At this time, the first control signal needs to be delayed by a first fixed duration with a certain length, thus ensuring the feasibility of the subsequent solution.

Exemplarily, when the first curve has a trough after the first control signal is delayed by the first fixed duration, determining the first delay based on a first preset delay corresponding to the trough of the first curve, specifically comprises:

acquiring respectively a first preset delay corresponding to the trough of the first curve.

determining respectively the first delay based on first preset delay and the first fixed duration.

Figure 27:
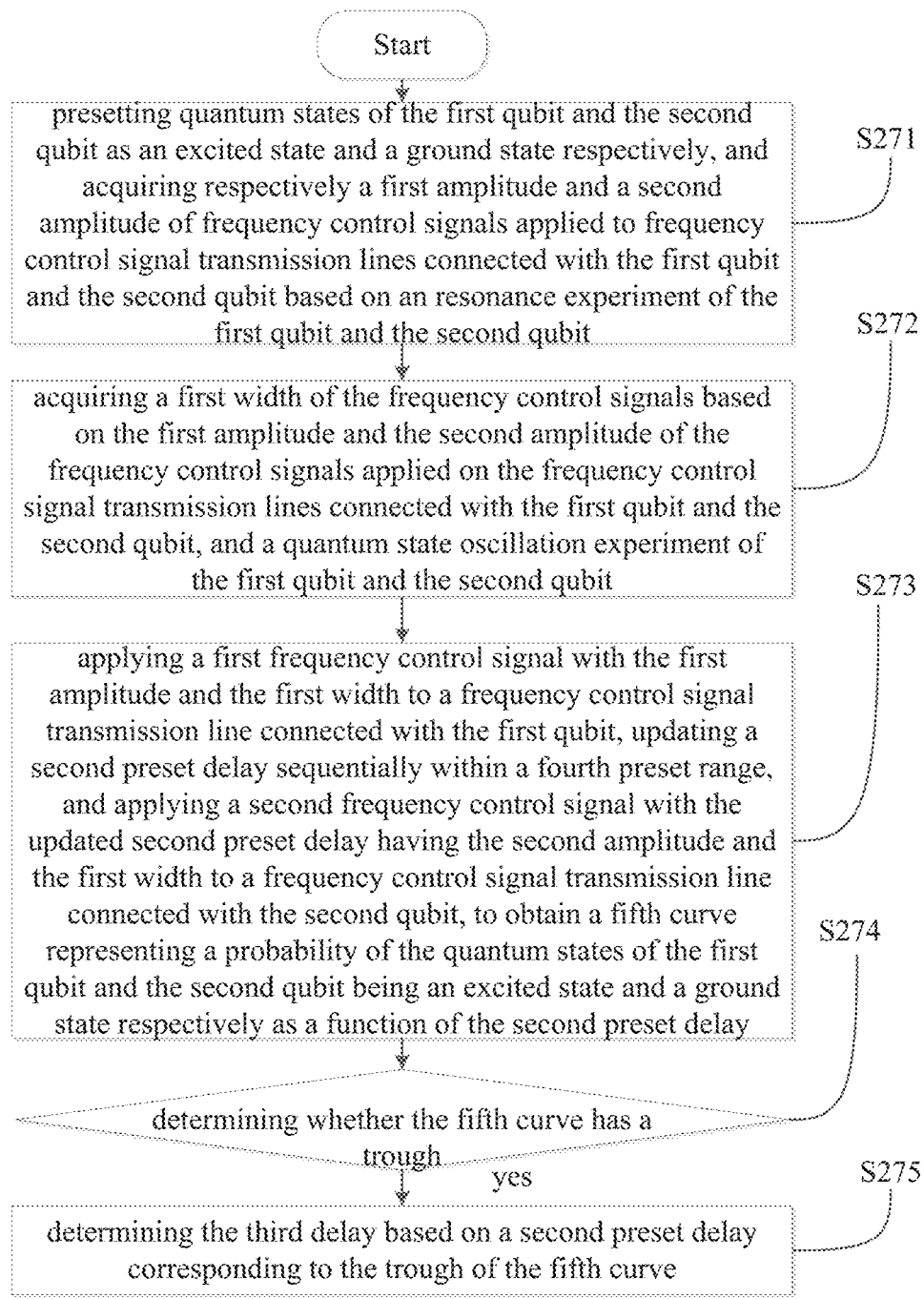
FIG. 27 is a schematic flow diagram of a method for acquiring a third delay between frequency control signal transmission lines connected with the first qubit and the second qubit respectively based on a representation of a quantum state evolution of two qubits coupled with each other as a function of their quantum state control signals and frequency control signals, provided by an embodiment of the present application.

For example, please refer to FIG. 27, acquiring the third delay between frequency control signal transmission lines connected with the first qubit and the second qubit respectively based on a representation of a quantum state evolution of two qubits coupled with each other as a function of their quantum state control signals and frequency control, specifically comprises.

S271, presetting quantum states of the first qubit and the second qubit as an excited state and a ground state respectively, and acquiring respectively a first amplitude and a second amplitude of frequency control signals applied to frequency control signal transmission lines connected with the first qubit and the second qubit based on a resonance experiment of the first qubit and the second qubit; wherein the resonance experiment is an experiment for measuring a coupling strength of the first qubit and the second qubit as a function of the amplitudes of the frequency control signals.

Specifically, a π-pulse quantum state control signal is applied to the first qubit through a quantum state control signal transmission line connected with the first qubit for controlling the quantum state of the first qubit to an excited state; and a unit pulse quantum state control signal is applied to the second qubit through a quantum state control signal transmission line connected with the second qubit for controlling the quantum state of the second qubit to the ground state. Based on this, a resonance experiment is conducted on the first qubit and the second qubit to obtain the first amplitude of the frequency control signal applied to the frequency control signal transmission line connected with the first qubit and the second amplitude of the frequency control signal applied to the frequency control signal transmission line connected with the second qubit w % ben the first qubit resonates with the second qubit and the coupling strength is the maximum (the frequencies of the two qubits are equal).

It should be noted that the frequency adjustment of the first qubit and that of the second qubit will affect each other, and then affect their quantum states. When the frequencies of the first qubit and the second qubit are adjusted to be equal, the coupling strength of the first qubit and the second qubit will be maximum, and the quantum states of the first qubit and the second qubit w % ill be exchanged, that is, the first qubit will decay from the excited state to the ground state, and the second qubit will be from the ground state to the excited state. It can be seen that the coupling strength of the first qubit and the second qubit will affect their quantum states. In the present embodiment, the resonance experiment is an experiment to measure the coupling strength of the first qubit and the second qubit as a function of the amplitudes of the frequency control signals, which is embodied in the experiment of the probability of the quantum states of the first qubit and the second qubit being an eigenstate (comprising a ground state and an eigenstate) as a function of the amplitudes of the frequency control signals.

S272, acquiring a first width of the frequency control signals based on the first amplitude and the second amplitude of the frequency control signals applied on the frequency control signal transmission lines connected with the first qubit and the second qubit, and a quantum state oscillation experiment of the first qubit and the second qubit; wherein the quantum state oscillation experiment is an experiment for measuring quantum states of the first qubit and the second qubit as a function of the width of the frequency control signals.

Specifically, a frequency control signal with a first amplitude is applied to the first qubit through a frequency control signal transmission line connected with the first qubit, and a frequency control signal with a second amplitude is applied to the second qubit through a frequency control signal connected with the second qubit. It can be known from S231 that at this time, the first qubit and the second qubit resonate and the coupling strength is maximum (the frequencies of the two qubits are equal). Based on this, the quantum state oscillation experiment is carried out on the first qubit and the second qubit to obtain the first width of the frequency control signals applied to the first qubit and the second qubit when the probability change of the quantum state of the first qubit and the second qubit is the most sensitive to the change of the width of the frequency control signal during the exchange process.

It should be noted that the widths of the frequency control signals applied to the first qubit and the second qubit are equal and change synchronously all along, that is, the durations of the frequency control signals applied to the first qubit and the second qubit are equal and change synchronously.

S273, applying a first frequency control signal with the first amplitude and the first width to a frequency control signal transmission line connected with the first qubit, updating a second preset delay sequentially within a fourth preset range, and applying a second frequency control signal with the updated second preset delay having the second amplitude and the first width to a frequency control signal transmission line connected with the second qubit, to obtain a fifth curve representing a probability of the quantum states of the first qubit and the second qubit being an excited state and a ground state respectively as a function of the second preset delay.

Specifically, the frequency control signal with a first amplitude and a first width is applied to the first qubit through the frequency control signal transmission line connected with the first qubit, and the preset delay is updated sequentially within a first preset range, and the frequency control signal with the updated second preset delay having a second amplitude and a first width is applied to the second qubit through the frequency control signal connected with the second qubit. As can be seen from S231 and S232, at this time, the first qubit and the second qubit resonate and coupling strength is maximum, and the probability of the quantum states of the first qubit and the second qubit being an eigenstate is the most sensitive to the change in the durations of the frequency control signals.

More specifically, the second preset delay is sequentially updated in a step incremental manner of ins within the fourth preset range. And when it is incremented every step, the frequency control signal with the updated second preset delay having a second amplitude and a first width is applied to the second qubit, and the data information that the probability of the quantum states of the first qubit and the second qubit being an excited state and a ground state respectively as a function of the second preset delay is measured once. Then all data information is plotted as a fifth curve representing the probability of the quantum states of the first qubit and the second qubit being an excited state and a ground state respectively as a function of the second preset delay as shown in FIG. 28, with the second preset delay as the horizontal axis and the probability of the quantum states of the first qubit and the second qubit being an excited state and a ground state respectively as the vertical axis.

The fourth preset range is set according to the lengths of the frequency control signal transmission lines connected with the first qubit and the second qubit respectively, so as to ensure that the second preset delay takes a value within the fourth preset range, and all effective data information can be obtained, so that the second change curve is complete.

S274, determining whether the fifth curve has a trough, and if the change curve has a trough, performing S275.

Figure 28:
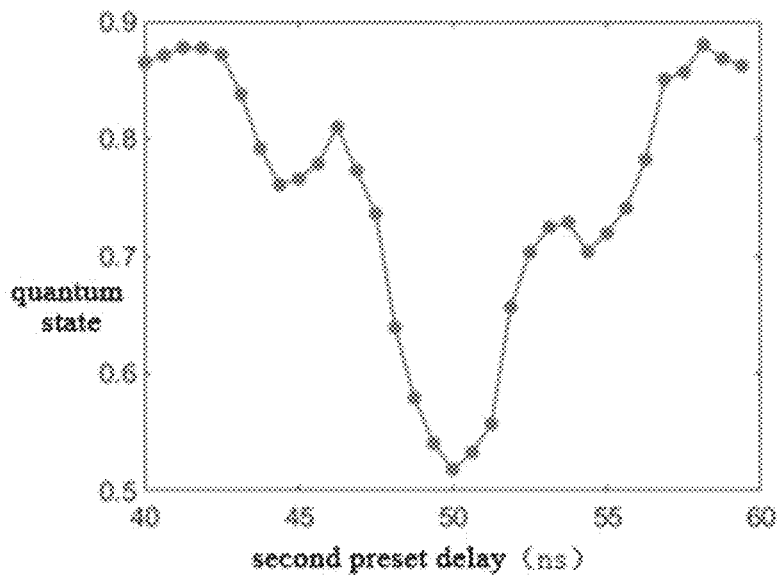
FIG. 28 is a fifth curve representing the a probability of the quantum states of the first qubit and the second qubit being an excited state and a ground state respectively as a function of the second preset delay, provided by an embodiment of the present application.

Specifically, in a possible embodiment, after the first preset delay is updated for many times, the fifth curve as shown in FIG. 28 is obtained statistically according to the measured data, and then it can be intuitively seen from FIG. 28 whether the fifth curve has a trough. In another possible embodiment, it is possible to refer to the aforementioned Step S3 to continuously determine whether the change curve has a trough during the process of dynamically updating the preset delay, which is not repeated here.

The actual situation at the trough is that: after the delay calibration is performed for the frequency control signal transmission lines connected with the first qubit and the second qubit based on the second preset delay corresponding to this point, when the two frequency control signals are transmitted to the first qubit and the second qubit respectively through their respective corresponding frequency control signal transmission lines, the widths of the waveforms of the two frequency control signals are aligned (that is, the start and end points of the waveforms of the two frequency control signals are aligned). From the foregoing description, it can be seen that when the waveforms of the frequency control signals of the first qubit and the second qubit are aligned (that is, the widths of the frequency control signals of the first qubit and the second qubit are equal, that is, the duration is equal), the interaction between the first qubit and the second qubit coupled with each other is the greatest, and the probability of the quantum state of the first qubit and the second qubit being the eigenstate is the most sensitive to the change of the durations of the frequency control signals, which shows that the probability of the quantum state of the first qubit and the second qubit being the excited state and the ground state respectively is the lowest and equal, specifically about 50%.

S275, determining the third delay based on a second preset delay corresponding to the trough of the fifth curve.

Exemplary, after determining whether the fifth curve has a trough, it further comprises:

if the fifth curve does not have a trough, delaying the first frequency control signal by a second fixed duration, and returning to perform S273.

Specifically, if the first curve having a trough cannot be obtained only by delaying the second frequency control signal, it means that the transmission speed of the frequency control signal transmission line connected with the second qubit is lower than the transmission speed of the frequency control signal transmission line connected with the first qubit. At this time, the first frequency control signal needs to be delayed by a second fixed time with a certain length, thus ensuring the feasibility of the subsequent solution.

For example, w % ben the fifth curve has a trough after the first frequency control signal is delayed by the second fixed duration, determining the third delay based on a second preset delay corresponding to the trough of the fifth curve, specifically comprises:

acquiring the second preset delay corresponding to the trough of the fifth curve.

determining the third delay based on the second preset delay and the second fixed duration.

Figure 29:
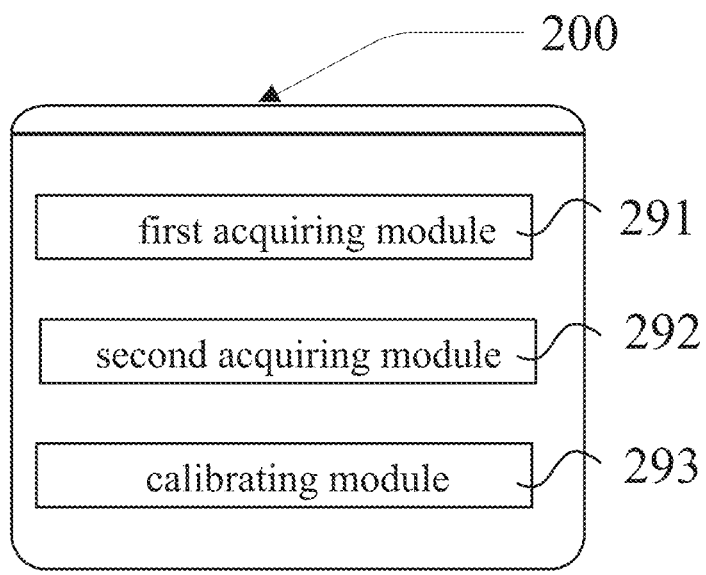
FIG. 29 is a schematic diagram of a structure of a calibration apparatus for the delay of a quantum computer system provided by an embodiment of the present application.

Based on the same inventive concept, an embodiment also provides a calibration apparatus for a delay of a quantum computer system. Please refer to FIG. 29, the calibration apparatus 200 specifically comprises:

a first acquiring module 291, configured for acquiring a first delay between a quantum state control signal transmission line and a frequency control signal transmission line connected with a first qubit and a second delay between a quantum state control signal transmission line and a frequency control signal transmission line connected with a second qubit based on a representation of a quantum state evolution of the qubits as a function of their quantum state control signals and frequency control signals; wherein the first qubit and the second qubit are coupled with each other;

a second acquiring module 292, configured for acquiring a third delay between frequency control signal transmission lines connected with the first qubit and the second qubit respectively based on a representation of a quantum state evolution of two qubits coupled with each other as a function of their quantum state control signals and frequency control signals, a calibrating module 293, configured for acquiring a fourth delay between quantum state control signal transmission lines connected with the first qubit and the second qubit based on the first delay, the second delay and the third delay, and performing delay calibration based on the fourth delay.

Based on the same inventive concept, the present embodiment also provides a quantum computer, comprising a quantum chip and the calibration apparatus for a delay of the quantum computer system above, wherein a plurality of qubits coupled with each other are arranged on the quantum chip, and each of the qubits is connected with a quantum state control signal transmission line and a frequency control signal transmission line, and the calibration apparatus for a delay of the quantum computer system is connected with the quantum state control signal transmission line and the frequency control signal transmission line for implementing the calibration method for a delay of the quantum computer system above.

To sum up, the calibration method and the calibration apparatus for a delay of a quantum computer system and the quantum computer provided by the present application have the following advantages that: the transmission delay caused by various microwave devices and different lengths on different quantum state control signal transmission lines can be eliminated, so that different frequency control signals can reach their corresponding qubits according to the designed time sequence and respectively excite the corresponding qubits at the same time, thus improving the control accuracy of the two qubit gates.

The embodiment of the present application also provides a computer-readable storage medium storing a computer program therein, which when executed by a processor, implements any one of the calibration method for a delay of a quantum computer system in the present application. The computer-readable storage medium can be any available medium that a computer can access or a data storage device such as a server, a data center and the like that contains one or more available medium. The available medium may be a magnetic medium (e.g., floppy disk, hard disk, magnetic tape), an optical medium (e.g., DVD), or a semiconductor medium (e.g., Solid State Disk (SSD)) and the like.

In yet another embodiment provided by the present application, a computer program product is also provided which contains instructions which, when run on a computer, cause the computer to perform any one of the calibration method for a delay of a computer system in the above embodiment. The computer can be general-purpose computers, computer networks, quantum computers or other programmable devices. The computer instruction can be stored in a computer-readable storage medium or transmitted from one computer-readable storage medium to another. For example, the computer instruction can be transmitted from one website, computer, server or data center to another website, computer, server or data center by wired (such as coaxial cable, optical fiber, digital subscriber line) or wireless (such as infrared, wireless, microwave, etc.).

In the above embodiments, it can be realized in whole or in part by software, hardware, firmware or any combination thereof. When implemented in software, it can be fully or partially implemented in the form of a computer program product. The computer program product comprises one or more computer instructions. When the computer program instruction is loaded and executed on a computer, the process or function described in the embodiment of the present application is generated in whole or in part.

It should be noted that, herein the technical features of various alternatives can be combined to form a solution as long as they are not contradictory, and these solutions are within the scope of this application. Relational terms such as first and second are only used to distinguish one entity or operation from another entity or operation, and do not necessarily require or imply that there is any such actual relationship or order between these entities or operations. Moreover, the terms "including", "comprising" or any other variation thereof are intended to cover non-exclusive inclusion, so that a process, method, article or device comprising a series of elements comprises not only those elements, but also other elements not explicitly listed or elements inherent to such process, method, article or device. Without further restrictions, an element defined by the phrase "comprising a/an . . . " does not exclude the existence of other identical elements in the process, method, article or device comprising the element.

Each embodiment in this specification is described in a related way, and only the same and similar parts between the embodiments can be referred to each other, and each embodiment focuses on the differences from other embodiments. Especially, for the embodiment of the apparatus, electronic device computer program product and storage medium, because it is basically similar to the embodiment of the method, the description is relatively simple, for relevant details, please refer to the partial description of the method embodiments.

The above description is only the preferred example of the embodiment of the present disclosure, and is not intended to limit the present application. Any modification, equivalent substitution, improvement, etc. made within the spirit and principle of the present application should be included in the protection scope of the present application.

What is claimed is:

1. A calibration method for a delay of a quantum computer system, comprising a quantum chip and a first transmission line and a second transmission line connecting a qubit on the quantum chip, wherein the calibration method comprises:
    applying a first control signal to the qubit on the quantum chip through the first transmission line, and simultaneously applying a second control signal with a preset delay to the qubit through the second transmission line; wherein the first control signal is to control a quantum state of the qubit to an eigenstate, the second control signal is to control a frequency of the qubit, and a change of the frequency of the qubit affects a probability of the quantum state being an eigenstate;
    updating the preset delay sequentially within a preset range, and applying the second control signal with the updated preset delay to the qubit to obtain a change curve representing a probability of the quantum state of the qubit being an eigenstate as a function of the preset delay; wherein the preset range is set according to lengths of the first transmission line and the second transmission line;
    determining whether the change curve has a trough; and
        if the change curve has a trough, performing delay calibration for the first transmission line and the second transmission line based on a preset delay corresponding to the trough of the change curve.

2. The calibration method for a delay according to claim 1, wherein performing delay calibration for the first transmission line and the second transmission line based on a preset delay corresponding to the trough of the change curve, specifically comprises:
    acquiring the preset delay corresponding to the trough of the change curve;
    determining an inherent delay between the first control signal and the second control signal;
    determining a relative delay between the first transmission line and the second transmission line based on the preset delay and the inherent delay;
    compensating the relative delay for the second control signal to perform the delay calibration for the first transmission line and the second transmission line;
    wherein determining a relative delay between the first transmission line and the second transmission line based on the preset delay and the inherent delay, specifically comprises;
    if T1>T2, determining the relative delay to be a difference between the preset delay and the inherent delay;
    if T1<T2, determining the relative delay to be a sum of the preset delay and the inherent delay;
    wherein, T1 is a wavelength period of the first control signal and T2 is a wavelength period of the second control signal.

3. The calibration method according to claim 1, wherein, determining whether the change curve has a trough, further comprises:
    if the change curve does not have a trough, delaying the first control signal by a first time, and returning to perform the step of applying the first control signal to the qubit on the quantum chip through the first transmission line;
    wherein when the change curve has the trough after the first control signal is delayed by the first time, performing delay calibration for the first transmission line and the second transmission line based on a preset delay corresponding to the trough of the change curve, specifically comprises:
    acquiring the preset delay corresponding to the trough of the change curve;
    determining an inherent delay between the first control signal and the second control signal;
    determining a relative delay between the first transmission line and the second transmission line based on the preset delay, the inherent delay and the first time;
    compensating the relative delay for the first control signal to perform the delay calibration for the first transmission line and the second transmission line;
    wherein determining a relative delay between the first transmission line and the second transmission line based on the preset delay, the inherent delay and the first time, specifically comprises:

if $T1>T2$, then $d3=d-d1-d2$:

if $T1<T2$, then $d3=d-d1+d2$;

wherein, d3 is the relative delay, d is the first time, d1 is the preset delay, d2 is the inherent delay, T1 is a wavelength period of the first control signal and T2 is a wavelength period of the second control signal.

4. The calibration method according to claim 1, wherein before applying a first control signal to the qubit on the quantum chip through the first transmission line, and simultaneously applying a second control signal with a preset delay to the qubit through the second transmission line, the method further comprises:

determining an inherent delay between the first control signal and the second control signal;

if T1>T2, delaying the second control signal by the inherent delay, so that a center of a waveform of the first control signal and a center of a waveform of the second control signal are aligned;

if T1<T2, delaying the first control signal by the inherent delay, so that a center of a waveform of the first control signal and a center of a waveform of the second control signal are aligned;

wherein, T1 is a wavelength period of the first control signal and T2 is a wavelength period of the second control signal;

wherein performing delay calibration for the first transmission line and the second transmission line based on a preset delay corresponding to the trough of the change curve, specifically comprises:

acquiring the preset delay corresponding to the trough of the change curve;

determining a relative delay between the first transmission line and the second transmission line based on the preset delay and the inherent delay;

compensating the relative delay for the second control signal to perform the delay calibration for the first transmission line and the second transmission line;

wherein determining a relative delay between the first transmission line and the second transmission line based on the preset delay and the inherent delay, specifically comprises:

if T1>T2, determining the relative delay to be equal to the preset delay;

if T1<T2, determining the relative delay to be equal to a sum of the preset delay and the inherent delay;

wherein, T1 is a wavelength period of the first control signal and T2 is a wavelength period of the second control signal.

5. The calibration method according to claim 4, wherein, determining whether the change curve has a trough, further comprises:

if the change curve does not have a trough, delaying the first control signal by a first time, and returning to perform the step of applying a first control signal to the qubit on the quantum chip through the first transmission line;

wherein when the change curve has the trough after the first control signal is delayed by the first time, performing delay calibration for the first transmission line and the second transmission line based on a preset delay corresponding to the trough of the change curve, specifically comprises:

acquiring the preset delay corresponding to the trough of the change curve;

determining a relative delay between the first transmission line and the second transmission line based on the preset delay, the inherent delay and the first time;

compensating the relative delay for the first control signal to perform the delay calibration for the first transmission line and the second transmission line;

wherein determining a relative delay between the first transmission line and the second transmission line based on the preset delay, the inherent delay and the first time, specifically comprises:

if $T1>T2$, then $d3=d-d1$;

if $T1<T2$, then $d3=d+d2-d1$;

wherein, d3 is the relative delay, d is the first time, d1 is the preset delay, d2 is the inherent delay, T1 is the wavelength period of the first control signal and T2 is the wavelength period of the second control signal.

6. The calibration method according to claim 1, wherein the first transmission line is a quantum state control signal transmission line, and the second transmission line is a frequency control signal transmission line, a plurality of qubits are arranged on the quantum chip, each of the qubits being connected with h quantum state control signal transmission line and h frequency control signal transmission line, wherein the calibration method further comprises:

presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits; wherein the resonance experiment is an experiment for measuring a coupling strength of the two qubits as a function of the amplitudes of the frequency control signals;

acquiring a first width of the frequency control signals based on the first amplitude and the second amplitude of the frequency control signals applied on the frequency control signal transmission lines of the two qubits and a quantum state oscillation experiment of the two qubits; wherein the quantum state oscillation experiment is an experiment for measuring quantum states of the two qubits as a function of the width of the frequency control signals;

applying a first frequency control signal with the first amplitude and the first width to a frequency control signal transmission line connected with one of the two qubits, updating a preset delay sequentially within a first preset range, and applying a second frequency control signal with the updated preset delay having the second amplitude and the first width to a frequency control signal transmission line connected with the other of the two qubits, to obtain a first curve representing a probability of the quantum states of the two qubits being an excited state and a ground state respectively as a function of the preset delay;

determining whether the first curve has a trough; and if the first curve has a trough, performing delay calibration for the frequency control signal transmission lines connected with the two qubits based on a preset delay corresponding to the trough of the first curve.

7. The calibration method according to claim 6, wherein presetting quantum states of two qubits coupled with each other as an excited state and a ground state respectively, and acquiring respectively a first amplitude and a second amplitude of frequency control signals applied to frequency control signal transmission lines of the two qubits based on a resonance experiment of the two qubits, specifically comprises:

applying a first quantum state control signal to a first qubit through the quantum state control signal transmission line, and applying a second quantum state control signal to a second qubit coupled with the first qubit through the quantum state control signal transmission line; wherein the first quantum state control signal is to control a quantum state of the first qubit to an excited state, and the second quantum state control signal is to control a quantum state of the second qubit to a ground state;

applying a second frequency control signal with the second amplitude to the second qubit through the frequency control signal transmission line, wherein the second amplitude is a preset fixed value;

updating an amplitude of the first frequency control signal sequentially within a second preset range, and applying the first frequency control signal with the updated amplitude to the first qubit through the frequency control signal transmission line, to obtain a second curve representing a probability of the quantum state of the first qubit being an excited state as a function of the amplitude of the first frequency control signal;

acquiring an amplitude corresponding to a trough of the second curve as the first amplitude of the first frequency control signal;

or wherein acquiring a first width of the frequency control signals based on the first amplitude and the second amplitude of the frequency control signals applied on the frequency control signal transmission lines of the two qubits and a quantum state oscillation experiment of the two qubits, specifically comprises:

applying a first frequency control signal with the first amplitude to the first qubit through the frequency control signal transmission line, and applying a second frequency control signal with the second amplitude to the second qubit through the frequency control signal transmission line;

updating widths of the first frequency control signal and the second frequency control signal sequentially within a third preset range, applying the first frequency control signal with the updated width to the first qubit through the frequency control signal transmission line, and applying the second frequency signal with the updated width to the second qubit through the frequency control signal transmission line; acquiring a third curve and a fourth curve, wherein the third curve represents a probability of the quantum state of the first qubit being an excited state and the quantum state of the second qubit being a ground state as a function of the widths, and the fourth curve represents a probability of the quantum state of the first qubit being a ground state and the quantum state of the second qubit being an excited state as a function of the widths; wherein the widths of the first frequency control signal and the second frequency control signal are always equal and varying synchronously;

acquiring a width corresponding to an intersection point of the third curve and the fourth curve as the first width of the first frequency control signal and of the second frequency control signal;

or wherein performing delay calibration for the frequency control signal transmission lines connected with the two qubits based on a preset delay corresponding to the trough of the first curve, specifically comprises:

acquiring the preset delay corresponding to the trough of the first curve as a target delay;

compensating the target delay for the second frequency control signal to perform the delay calibration for the frequency control signal transmission lines connected with the two qubits;

or wherein, determining whether the change curve has a trough, further comprises:

if the change curve does not have a trough, delaying the first frequency control signal by a first time, and returning to perform a step of applying a first frequency control signal with the first amplitude and the first width to a frequency control signal transmission line connected with one of the two qubits.

8. The calibration method according to claim 7, wherein acquiring a width corresponding to an intersection point of the third curve and the fourth curve as the first width of the first frequency control signal and of the second frequency control signal, specifically comprises:

acquiring widths corresponding to each of intersection points of the third curve and the fourth curve;

selecting a smallest width among respective widths as the first width.

9. The calibration method according to claim 7, wherein when the first curve has a trough after the first frequency control signal is delayed by the first time, performing delay calibration for the frequency control signal transmission lines connected with the two qubits based on a preset delay corresponding to the trough of the first curve, specifically comprises:

acquiring the preset delay corresponding to the trough of the first curve as a target delay;

determining a relative delay between the frequency control signal transmission lines of the two qubits based on the first time and the target delay;

compensating the relative delay for the first frequency control signal to perform the delay calibration for the frequency control signal transmission lines connected with the two qubits;

wherein the relative delay is an absolute value of the difference between the first time and the target delay.

10. The calibration method according to claim 6, wherein the calibration method further comprises:

acquiring a first delay between a quantum state control signal transmission line and a frequency control signal transmission line connected with a first qubit and a second delay between a quantum state control signal transmission line and a frequency control signal transmission line connected with a second qubit; wherein the first qubit and the second qubit are coupled with each other, acquiring a third delay between frequency control signal transmission lines connected with the first qubit and the second qubit respectively;

acquiring a fourth delay between quantum state control signal transmission lines connected with the first qubit and the second qubit based on the first delay, the second delay and the third delay, and performing delay calibration based on the fourth delay.

11. The calibration method according to claim 10, wherein acquiring a first delay between a quantum state control signal transmission line and a frequency control signal transmission line connected with a first qubit and a second delay between a quantum state control signal transmission line and a frequency control signal transmission line connected with a second qubit, specifically comprises:

acquiring the first delay between the quantum state control signal transmission line and the frequency control signal transmission line connected with the first qubit and the second delay between the quantum state control signal transmission line and the frequency control signal transmission line connected with the second qubit based on a representation of a quantum state evolution of the qubits as a function of their quantum state control signals and frequency control signals;

wherein acquiring a third delay between frequency control signal transmission lines connected with the first qubit and the second qubit respectively, specifically comprises:
acquiring the third delay between frequency control signal transmission lines connected with the first qubit and the second qubit respectively based on a representation of a quantum state evolution of two qubits coupled with each other as a function of their quantum state control signals and frequency control signals.

12. The calibration method according to claim 11, wherein acquiring a first delay between the quantum state control signal transmission line and the frequency control signal transmission line connected with the first qubit based on a representation of a quantum state evolution of the qubit as a function of its quantum state control signal and frequency control signal, specifically comprises:
applying a first control signal to the first qubit through a quantum state control signal transmission line connected with the first qubit, and applying a second control signal with a first preset delay to the first qubit through a frequency control signal transmission line connected with the first qubit; wherein, the first control signal is to control a quantum state of the first qubit to an eigenstate, and the second control signal is to control a frequency of the first qubit, and a change of the frequency of the first qubit affects a probability of the quantum state being an eigenstate;
updating the first preset delay sequentially within a first preset range, and applying a second control signal with the updated first preset delay to the first qubit to obtain a first curve representing a probability of the quantum state of the first qubit being an eigenstate as a function of the first preset delay; wherein the first preset range is set according to lengths of the quantum state control signal transmission line and the frequency control signal transmission line connected with the first qubit;
determining whether the first curve has a trough; and if the first curve has a trough, determining the first delay based on a first preset delay corresponding to the trough of the first curve.

13. The calibration method according to claim 12, wherein, after determining whether the first curve has a trough, the method further comprises:
if the change curve does not have a trough, delaying the first control signal by a first fixed duration, and returning to perform the step of applying the first control signal to the first qubit through the quantum state control signal transmission line connected with the first qubit;
wherein when the first curve has a trough after the first control signal is delayed by the first fixed duration, determining the first delay based on a first preset delay corresponding to the trough of the first curve, specifically comprises:
acquiring respectively a first preset delay corresponding to the trough of the first curve;
determining respectively the first delay based on first preset delay and the first fixed duration.

14. The calibration method as claimed in claim 11, wherein acquiring the third delay between frequency control signal transmission lines connected with the first qubit and the second qubit respectively based on a representation of a quantum state evolution of two qubits coupled with each other as a function of their quantum state control signals and frequency control signals, specifically comprises:
presetting quantum states of the first qubit and the second qubit as an excited state and a ground state respectively, and acquiring respectively a first amplitude and a second amplitude of frequency control signals applied to frequency control signal transmission lines connected with the first qubit and the second qubit based on a resonance experiment of the first qubit and the second qubit; wherein the resonance experiment is an experiment for measuring a coupling strength of the first qubit and the second qubit as a function of the amplitudes of the frequency control signals;
acquiring a first width of the frequency control signals based on the first amplitude and the second amplitude of the frequency control signals applied on the frequency control signal transmission lines connected with the first qubit and the second qubit, and a quantum state oscillation experiment of the first qubit and the second qubit; wherein the quantum state oscillation experiment is an experiment for measuring quantum states of the first qubit and the second qubit as a function of the width of the frequency control signals;
applying a first frequency control signal with the first amplitude and the first width to a frequency control signal transmission line connected with the first qubit, updating a second preset delay sequentially within a fourth preset range, and applying a second frequency control signal with the updated second preset delay having the second amplitude and the first width to a frequency control signal transmission line connected with the second qubit, to obtain a fifth curve representing a probability of the quantum states of the first qubit and the second qubit being an excited state and a ground state respectively as a function of the second preset delay;
determining whether the fifth curve has a trough; and if the fifth curve has a trough, determining the third delay based on a second preset delay corresponding to the trough of the fifth curve.

15. The calibration method according to claim 14, wherein, after determining whether the fifth curve has a trough, the method further comprises:
if the fifth curve does not have a trough, delaying the first frequency control signal by a second fixed duration, and returning to perform a step of applying the first frequency control signal with the first amplitude and the first width to the frequency control signal transmission line connected with the first qubit;
wherein when the fifth curve has a trough after the first frequency control signal is delayed by the second fixed duration, determining the third delay based on a second preset delay corresponding to the trough of the fifth curve, specifically comprises:
acquiring the second preset delay corresponding to the trough of the fifth curve;
determining the third delay based on the second preset delay and the second fixed duration.

16. The calibration method according to claim 10, wherein acquiring a fourth delay between quantum state control signal transmission lines connected with the first qubit and the second qubit based on the first delay, the second delay and the third delay, specifically comprises:
presetting a duration of a quantum state control signal applied to the quantum state control signal transmission line connected with the first qubit as a first time;
determining a duration of a frequency control signal applied to the frequency control signal transmission line connected with the first qubit as a second time based on the first time and the first delay;

determining a duration of a frequency control signal applied to the frequency control signal transmission line connected with the second qubit as a third time based on the second time and the third delay;

determining a duration of a quantum state control signal applied to the quantum state control signal transmission line connected with the second qubit as a fourth time based on the third time and the second delay;

determining the fourth delay between quantum state control signal transmission lines connected with the first qubit and the second qubit respectively based on the first time and the fourth time.

17. A quantum computer, comprising a quantum chip and a calibration apparatus for a delay of a quantum computer system, wherein a plurality of qubits coupled with each other are arranged on the quantum chip, and each of the qubits is connected with a quantum state control signal transmission line and a frequency control signal transmission line, and the calibration apparatus for a delay of the quantum computer system is connected with the quantum state control signal transmission line and the frequency control signal transmission line for implementing the calibration method for a delay of the quantum computer system according to claim 10.

18. A quantum computer, comprising a quantum chip and a calibration apparatus for a delay of a quantum computer system, wherein a plurality of qubits coupled with each other are arranged on the quantum chip, and each of the qubits is connected with a quantum state control signal transmission line and a frequency control signal transmission line, and the calibration apparatus for a delay of the quantum computer system is connected with the quantum state control signal transmission line and the frequency control signal transmission line for implementing the calibration method for a delay of the quantum computer system according to claim 6.

19. A quantum computer system, comprising a quantum chip, a first transmission line and a second transmission line connected with a qubit on the quantum chip, and a calibration apparatus for a delay of the quantum computer system, wherein the calibration apparatus for the delay of the quantum computer system is connected with the first transmission line and the second transmission line for implementing the calibration method for a delay of the quantum computer system according to claim 1.

20. A non-transitory computer-readable storage medium storing a computer program therein, which when executed by a processor, implements the calibration method for a delay of a quantum computer system according to claim 1.

* * * * *

UNITED STATES PATENT AND TRADEMARK OFFICE
CERTIFICATE OF CORRECTION

PATENT NO. : 11,984,895 B2
APPLICATION NO. : 18/520248
DATED : May 14, 2024
INVENTOR(S) : Weicheng Kong and Hanqing Shi It is certified that error appears in the above-identified patent and that said Letters Patent is hereby corrected as shown below:

On the Title Page

Item (72), change inventors name "Hanging Shi" to --Hanqing Shi--

In the Claims

In Claim 6, Column 46, Line 10, please replace "h" with --the-- therefore.

In Claim 6, Column 46, Line 11, please replace "h" with --the-- therefore.

Signed and Sealed this
Eighteenth Day of June, 2024

*Katherine Kelly Vidal*

Katherine Kelly Vidal
*Director of the United States Patent and Trademark Office*